(12) United States Patent
Huang et al.

(10) Patent No.: US 11,222,867 B1
(45) Date of Patent: Jan. 11, 2022

(54) PACKAGE AND MANUFACTURING METHOD THEREOF

(71) Applicant: Taiwan Semiconductor Manufacturing Co., Ltd., Hsinchu (TW)

(72) Inventors: Sung-Hui Huang, Yilan County (TW); Shang-Yun Hou, Hsinchu (TW); Kuan-Yu Huang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/924,203

(22) Filed: Jul. 9, 2020

(51) Int. Cl.
| H01L 23/48 | (2006.01) |
| H01L 23/52 | (2006.01) |
| H01L 29/40 | (2006.01) |
| H01L 25/065 | (2006.01) |
| H01L 23/00 | (2006.01) |
| H01L 23/31 | (2006.01) |
| H01L 21/56 | (2006.01) |

(52) U.S. Cl.
CPC ........ *H01L 25/0652* (2013.01); *H01L 21/561* (2013.01); *H01L 21/565* (2013.01); *H01L 23/3128* (2013.01); *H01L 23/481* (2013.01); *H01L 24/08* (2013.01); *H01L 24/16* (2013.01); *H01L 24/32* (2013.01); *H01L 24/73* (2013.01); *H01L 24/97* (2013.01); *H01L 2224/0401* (2013.01)

(58) Field of Classification Search
CPC combination set(s) only.
See application file for complete search history.

(56) References Cited

U.S. PATENT DOCUMENTS

| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2012/0241795 | A1* | 9/2012 | Chang | G02B 6/4214 257/98 |
| 2019/0237454 | A1* | 8/2019 | Hou | H01L 25/18 |
| 2019/0333905 | A1* | 10/2019 | Raghunathan | G02B 6/4274 |
| 2020/0003975 | A1* | 1/2020 | Yu | H01L 24/94 |

* cited by examiner

*Primary Examiner* — Niki H Nguyen
(74) *Attorney, Agent, or Firm* — JCIPRNET

(57) ABSTRACT

A package includes a first die, a second die, a semiconductor frame, and a reinforcement structure. The first di has a first surface and a second surface opposite to the first surface. The first die includes grooves on the first surface. The second die and the semiconductor frame are disposed side by side over the first surface of the first die. The semiconductor frame has at least one notch exposing the grooves of the first die. The reinforcement structure is disposed on the second surface of the first die. The reinforcement structure includes a first portion aligned with the grooves.

20 Claims, 33 Drawing Sheets

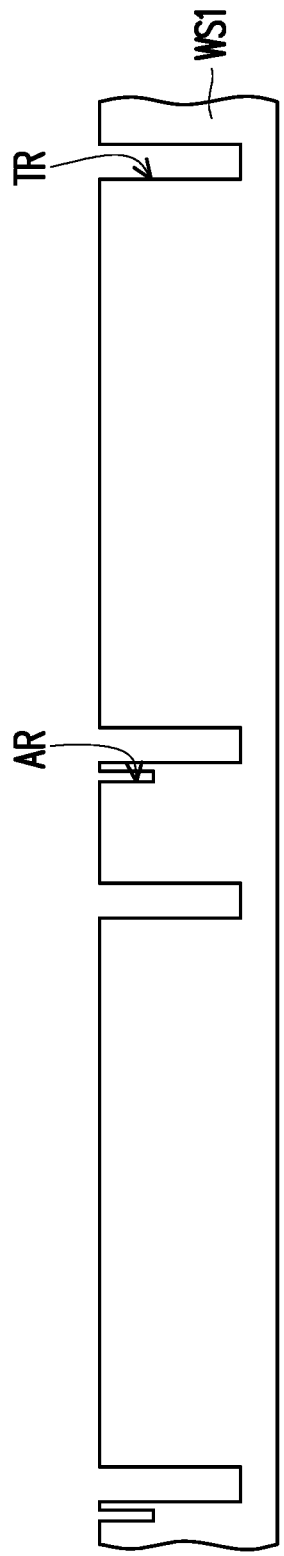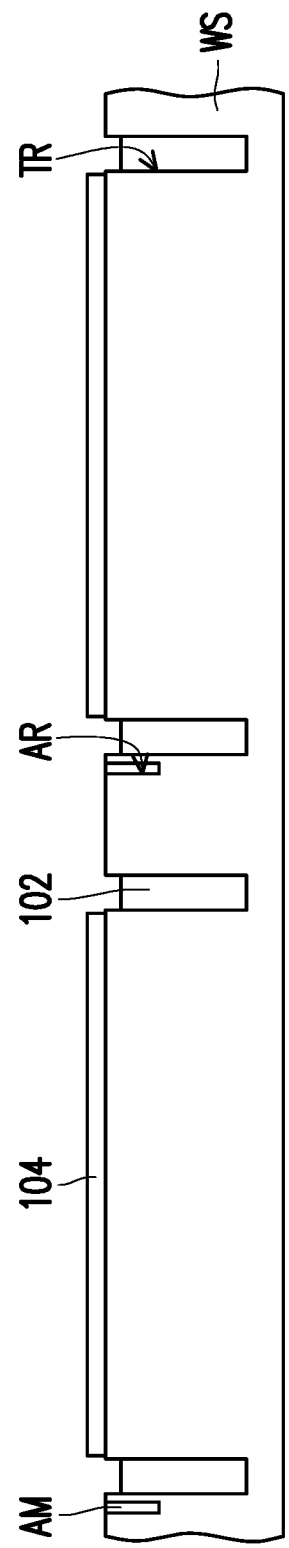

PACKAGE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging. How to ensure the reliability of the wafer level packaging has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1C:
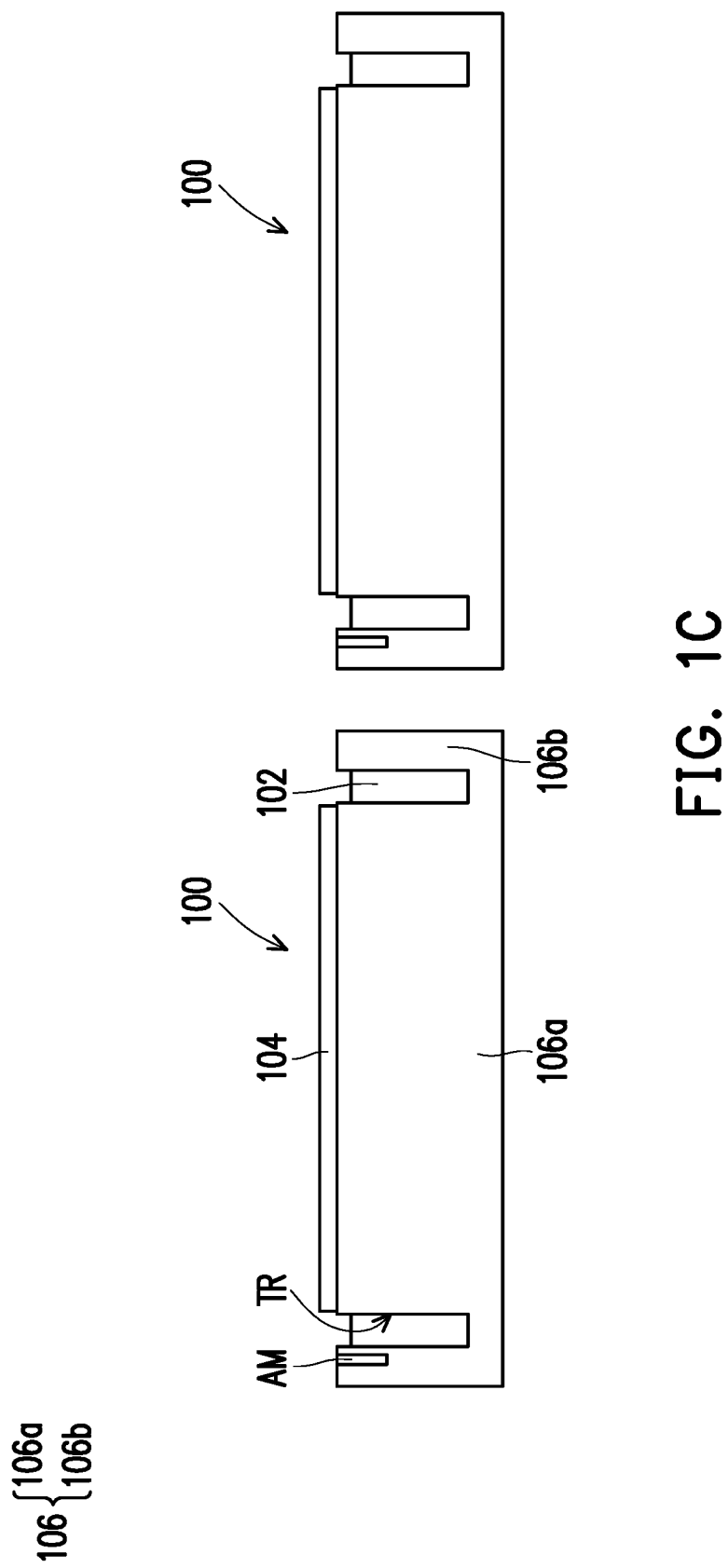
FIG. 1A to FIG. 1O are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1O are schematic cross-sectional views illustrating a manufacturing process of a package 10 in accordance with some embodiments of the disclosure. Referring to FIG. 1A, a wafer substrate WS1 is provided. In some embodiments, the wafer substrate WS1 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, the semiconductor wafer WS1 includes a plurality of trenches TR formed therein. In some embodiments, each trench TR exhibits a ring-shape from the top view. In some embodiments, the trenches TR are arranged in an array. In some embodiments, the wafer substrate WS1 further includes a plurality of alignment recesses AR formed therein. In some embodiments, each alignment recess AR exhibits an L-shape or a cross-shape from the top view. As illustrated in FIG. 1A, the trenches TR and the alignment recesses AR extend downwardly from a top surface of the wafer substrate WS1 into the interior of the wafer substrate WS1. In some embodiments, a depth of the alignment recesses AR is smaller than a depth of the trenches TR. On the other hand, the depth of the alignment recesses AR and the depth of the trenches TR are both smaller than a thickness of the wafer substrate WS1. For example, the depth of the trenches TR may range from about 50 micrometers to about 600 micrometers, which is about 7% to about 80% of the thickness of the wafer substrate WS1, and the depth of the alignment recesses AR may range from about 30 micrometers to about 300 micrometers, which is be about 4% to about 40% of the thickness of the wafer substrate WS1. That is, the trenches TR and the alignment recesses AR do not penetrate through the wafer substrate WS1. In some embodiments, the trenches TR and the alignment recesses AR may be formed by etching or other suitable processes. In some embodiments, the alignment recesses AR may be optional. It should be noted that that the number of the trenches TR and the number of the alignment recesses AR illustrated in FIG. 1A are merely for illustrative purposes, and the disclosure is not limited thereto. In some alternative embodiments, fewer or more trenches TR and alignment recesses AR may be included in the wafer substrate WS1 depending on the layout design.

Referring to FIG. 1B, the trenches TR of the semiconductor wafer WS1 is partially filled with a dielectric material to form dummy rings 102. For example, the dummy rings 102 covers a bottom surface and a portion of sidewalls of the trenches TR. On the other hand, another portion of the sidewalls of the trenches TR is not being covered by the dummy rings 102. In some embodiments, the dielectric material is also filled into the alignment recesses AR to form alignment marks AM. In some embodiments, the dielectric material fills the alignment recesses AR completely to form the alignment marks AM. In some embodiments, the dielectric material is further deposited on portions of the top surface of the semiconductor wafer WS1 to form protective coatings 104. For example, the protective coatings 104 cover portions of the top surface of the wafer substrate WS1 which are enclosed by the trenches TR. As illustrated in FIG. 1B, the dummy rings 102 and the alignment marks AM are embedded in the wafer substrate WS1 and are not covered by the protective coatings 104. Since the dummy rings 102 partially fill the trenches TR and do not protrude from the top surface of the wafer substrate WS1, the dummy rings 102 are not in direct contact with the protective coatings 104. In some embodiments, top surfaces of the dummy rings 102 are lower than the top surface of the wafer substrate WS1, and the level height difference between the top surfaces of the dummy rings 102 and the top surface of the wafer substrate WS1 ranges from about 3 micrometers to about 50 micrometers.

In some embodiments, the dummy rings 102, the alignment marks AM, and the protective coatings 104 are simultaneously formed. That is, the dummy rings 102, the alignment marks AM, and the protective coatings 104 are made of the same material. For example, a material of the dummy rings 102, the alignment marks AM, and the protective coatings 104 includes polyimide, epoxy resin, acrylic resin, phenol resin, benzocyclobutene (BCB), polybenzooxazole (PBO), or any other suitable polymer-based dielectric materials. However, the disclosure is not limited thereto. In some alternative embodiments, the dummy rings 102, the alignment marks AM, and the protective coatings 104 may be formed separately by different materials. In some embodiments, the dummy rings 102, the alignment marks AM, and the protective coatings 104 may be formed by a three-dimensional printing process. Alternatively, the dummy rings 102, the alignment marks AM, and the protective coatings 104 may be formed by a deposition process, such as chemical vapor deposition (CVD), plasma-enhanced chemical vapor deposition (PECVD), or the like.

Referring to FIG. 1B and FIG. 1C, the wafer substrate WS1 illustrated in FIG. 1B is singulated to form a plurality of dummy dies 100. In some embodiments, the dicing process or the singulation process typically involves dicing with a rotating blade or a laser beam. In other words, the dicing or singulation process is, for example, a laser cutting process, a mechanical cutting process, or other suitable processes. As illustrated in FIG. 1C, each dummy die 100 includes a semiconductor substrate 106, a dummy ring 102, an alignment mark AM, and a protective coating 104. The dummy ring 102 and the alignment mark AM are embedded in the semiconductor substrate 106, and the protective coating 104 is disposed on a surface of the semiconductor substrate 106. In some embodiments, the trench TR and the dummy ring 102 divide the semiconductor substrate 106 into an inner portion 106a and an outer portion 106b. As illustrated in FIG. 1C, the inner portion 106a and the outer portion 106b are connected to each other by the bottom portion of the semiconductor substrate 106. In some embodiments, the dummy die 100 may be free of active components and passive components. Alternatively, the dummy die 100 may include active components and passive components with functions of these components being disabled.

Figure 1D:
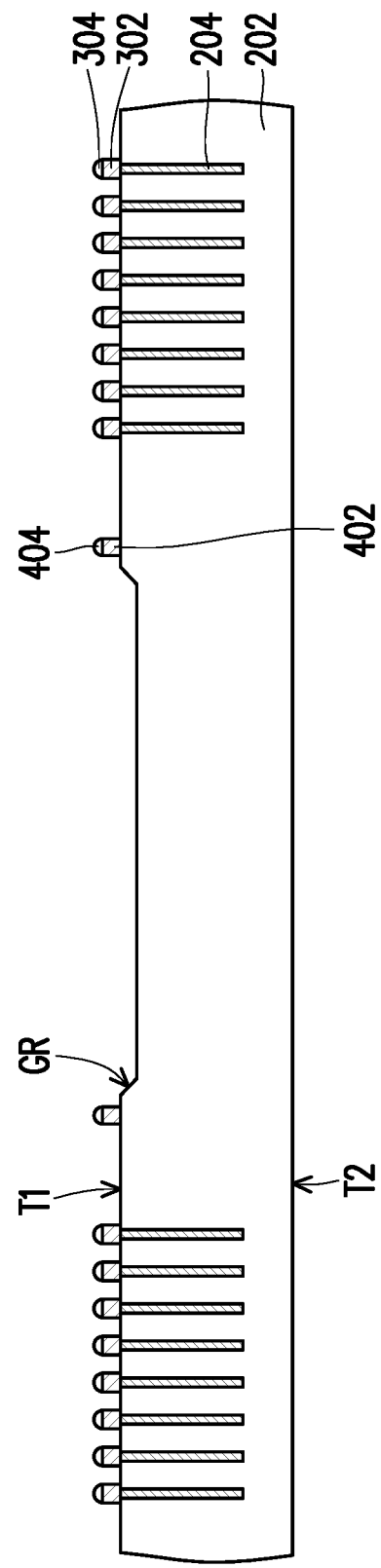

Referring to FIG. 1D, a wafer substrate WS2 is provided. In some embodiments, the wafer substrate WS2 includes a semiconductor substrate 202 and a plurality of through semiconductor vias (TSV) 204 embedded in the semiconductor substrate 202. In some embodiments, the semiconductor substrate 202 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 202 has a plurality of semiconductor devices (e.g., transistors, capacitors, photodiodes, combinations thereof, or the like) and a plurality of optical devices (e.g. waveguides, filters, photodiodes, light-emitting diodes, combinations thereof, or the like) formed therein. In some embodiments, a depth of the TSVs 204 is smaller than a thickness of the semiconductor substrate 202. That is, at this stage, the TSVs 204 do not penetrate through the semiconductor substrate 202.

In some embodiments, the wafer substrate WS2 has a first surface T1 and a second surface T2 opposite to the first surface T1. As illustrated in FIG. 1D, a plurality of grooves GR is formed on the first surface T1 of the wafer substrate WS2. In some embodiments, the grooves GR may be V-grooves (shown in FIG. 3A) formed by etching, laser cutting, or other suitable processes. It should be noted that the number of the grooves illustrated in FIG. 1D is merely for illustrative purpose, and the disclosure is not limited thereto. In some alternative embodiments, fewer or more grooves GR may be formed in the wafer substrate WS2 depending on the layout design.

As illustrated in FIG. 1D, a plurality of connectors 300 and a dam structure 400 are formed on the first surface T1 of the semiconductor wafer WS2. In some embodiments, each of the connectors 300 includes a conductive pillar 302 and a conductive bump 304 disposed on the conductive pillar 302. As illustrated in FIG. 1D, the conductive pillars 302 are disposed corresponding to the TSVs 204. In some embodiments, the connectors 300 are referred to as "micro bumps." In some embodiments, the connectors 300 may be formed by the following steps. First, a seed layer (not shown) is blanketly formed over the wafer substrate WS2. The seed layer may be formed through, for example, a sputtering process, a physical vapor deposition (PVD) process, or the like. In some embodiments, the seed layer may include, for example, copper, titanium-copper alloy, or other suitable choice of materials. Subsequently, a photoresist pattern layer (not shown) is formed over the seed layer. The photoresist pattern layer has openings exposing portions of the seed layer. In some embodiments, locations of the exposed portions of the seed layer correspond to locations of the TSVs 204 of the wafer substrate WS2. Thereafter, a conductive material (not shown) and a solder material (not shown) are sequentially deposited onto the exposed seed layer. That is, the conductive material and the solder material are located within the openings of the photoresist pattern layer. In some embodiments, the conductive material and the solder material may be formed by a plating process. The plating process is, for example, electro-plating, electroless-plating, immersion plating, or the like. In some embodiments, the conductive material includes, for example, copper, copper alloys, or the like. After the conductive material and the solder material are formed, the photoresist pattern layer is removed. Upon removal of the photoresist pattern layer, portions of the seed layer, which are not covered by the conductive material and the solder material, are exposed. In some embodiments, the photoresist pattern layer may be removed/stripped through, for example, etching, ashing, or other suitable removal processes. Then, the seed layer that is not covered by the conductive material and the solder material is removed. The exposed portions of the seed layer may be removed through an etching process. In some embodiments, the remaining seed layer and the conductive material constitute the conductive pillars 302. Thereafter, a reflow process is performed on the solder material to transform the solder material into the conductive bumps 304.

In some embodiments, the dam structure 400 is formed to surround the grooves GR. On the other hand, the dam structure 400 is surrounded by the connectors 300. In some embodiments, the dam structure 400 includes a conductive ring 402 and a conductive protrusion 404 disposed on the conductive ring 402. In some embodiments, the connectors 300 and the dam structure 400 may be formed simultaneously. For example, the conductive pillars 302 of the connectors 300 and the conductive ring 402 of the dam structure 400 may be formed by the same process step. On the other hand, the conductive bumps 304 of the connectors 300 and the conductive protrusion 404 of the dam structure 400 may also be formed by the same process step. In some embodiments, the dam structure 400 may exhibit a ring-shape enclosing the grooves GR from the top view. In some embodiments, the dimension (i.e. thickness and width), the position, and the shape of the dam structure 400 may be designed to correspond to the trench TR of the dummy die 100 in FIG. 1C. For example, the height of the dam structure 400 may range from about 5 micrometers to about 50 micrometers.

Figure 1E:
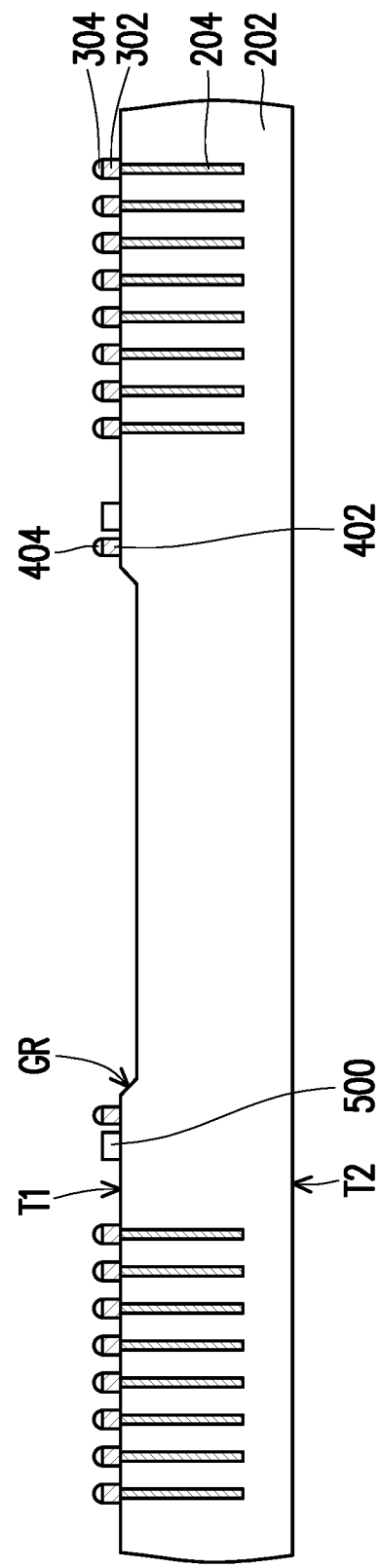

Referring to FIG. 1E, an adhesive layer 500 is formed on the first surface T1 of the wafer substrate WS2. In some embodiments, a material of the adhesive layer 500 includes a thermally curable polymer. In some embodiments, the adhesive layer 500 is formed on the first surface T1 of the wafer substrate WS2 through a dispensing process, a screen printing process, an inkjet printing process, a three-dimensional printing process, or the like. In some embodiments, the adhesive layer 500 is located between the connectors 300 and the dam structure 400. In some embodiments, the adhesive layer 500 exhibits a ring-shape from the top view. That is, the adhesive layer 500 surrounds dam structure 400. In some embodiments, the adhesive layer 500 may keep a lateral distance from the dam structure 400. However, the disclosure is not limited thereto. In some alternative embodiments, the adhesive layer 500 may be adhered to the dam structure 400. As illustrated in FIG. 1E, a thickness of the adhesive layer 500 is smaller than the height of the dam structure 400. In some embodiments, the distribution of the adhesive layer 500 may correspond to the outer portion 106b of the semiconductor substrate 106 of the dummy die 100 in FIG. 1C.

Figure 1F:
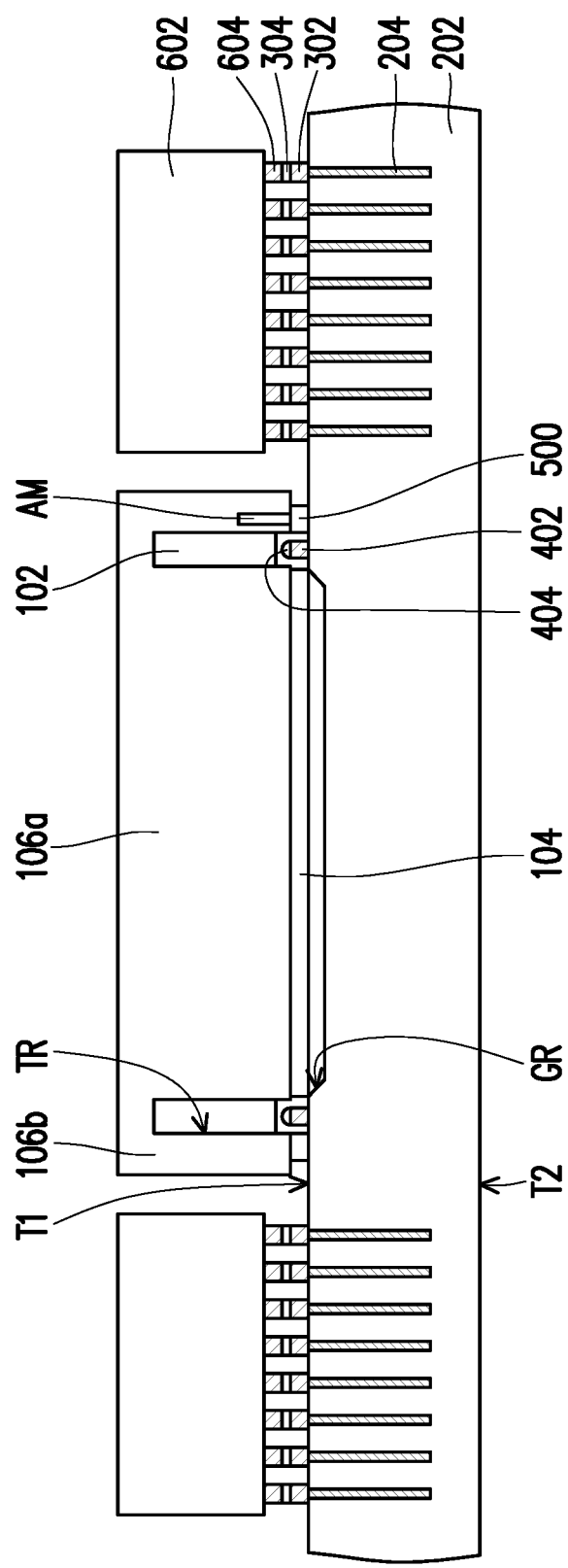

Referring to FIG. 1F, the dummy die 100 illustrated in FIG. 1C and dies 600 are placed over the first surface T1 of the wafer substrate WS2. In some embodiments, the dummy die 100 and the dies 600 may be placed through a pick-and-place process. In some embodiments, the dummy die 100 and the dies 600 are disposed side by side over the first surface T1 of the wafer substrate WS2. For example, the dummy die 100 may be placed between two adjacent dies 600. As illustrated in FIG. 1F, the dummy die 100 is placed to cover the grooves GR, the dam structure 400, and the adhesive layer 500 while the dies 600 are placed to cover the connectors 300.

In some embodiments, the dummy die 100 may be placed over the wafer substrate WS2 through the following steps. First, the trench TR of the dummy die 100 and the dam structure 400 are aligned. In some embodiments, the alignment between the trench TR of the dummy die 100 and the dam structure 400 may be achieved by the aid of the alignment mark AM. Thereafter, the dummy die 100 is being moved downward to fit the dam structure 400 into the trench TR of the dummy die 100. That is, the dam structure 400 is inserted into the trench TR. Meanwhile, the outer portion 106b of the semiconductor substrate 106 of the dummy die 100 is attached to the adhesive layer 500. In other words, the adhesive layer 500 is sandwiched between the wafer substrate WS2 and the dummy die 100. By fitting the dam structure 400 into the trench TR and by attaching the outer portion 106b of the semiconductor substrate 106 of the dummy die 100 to the adhesive layer 500, the dummy die 100 may be temporarily fixed in position. Subsequently, the dummy die 100 is pressed against the adhesive layer 500 to ensure the outer portion 106b of the semiconductor substrate 106 of the dummy die 100 is securely fixed onto the adhesive layer 500. Thereafter, the adhesive layer 500 is cured to strengthen the adhesion between the wafer substrate WS2 and the outer portion 106b of the semiconductor substrate 106 of the dummy die 100. As illustrated in FIG. 1F, the dam structure 400 is spaced apart from the dummy ring 102 of the dummy die 100. However, the disclosure is not limited thereto. In some alternative embodiments, the dam structure 400 is directly in contact with the dummy ring 102 of the dummy die 100.

As illustrated in FIG. 1F, the protective coating 104 of the dummy die 100 covers the grooves GR of the wafer substrate WS2. In some embodiments, the protective coating 104 serves the purpose of protecting the grooves GR from being damaged. In some embodiments, the protective coating 104 is in direct contact with the first surface T1 of the wafer substrate WS2. However, the disclosure is not limited thereto. In some alternative embodiments, the protective coating 104 may be spaced apart from the first surface T1 of the wafer substrate WS2.

In some embodiments, the die 600 includes a semiconductor substrate 602 and a plurality of conductive pads 604 formed on the semiconductor substrate 602. In some embodiments, the semiconductor substrate 602 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 602 may include active components (e.g., transistors or the like) and optionally passive components (e.g., resistors, capacitors, inductors or the like) formed therein. The conductive pads 604 are distributed over the semiconductor substrate 602. In some embodiments, the conductive pads 604 includes, for example, aluminum pads, copper pads, or other suitable metal pads. As illustrated in FIG. 1F, the dies 600 are placed such that the conductive pads 604 of dies 600 are attached to the connectors 300. For example, each of conductive pads 604 is directly in contact with the corresponding conductive bump 304. After the dies 600 are placed on the connectors 300, a reflow process may be performed to fix the conductive pads 604 onto the conductive bumps 304. As such, electrical connection between the dies 600 and the wafer substrate WS2 may be realized through the connectors 300. That is, the connectors 300 are disposed between the wafer substrate WS2 and the dies 600, and the dies 600 are electrically connected to the wafer substrate WS2 through the connectors 300.

In some embodiments, the attachment of the dummy die 100 is performed prior to the bonding of the dies 600. However, the disclosure is not limited thereto. In some alternative embodiments, the bonding of the dies 600 is performed prior to the attachment of the dummy die 100.

Figure 1G:
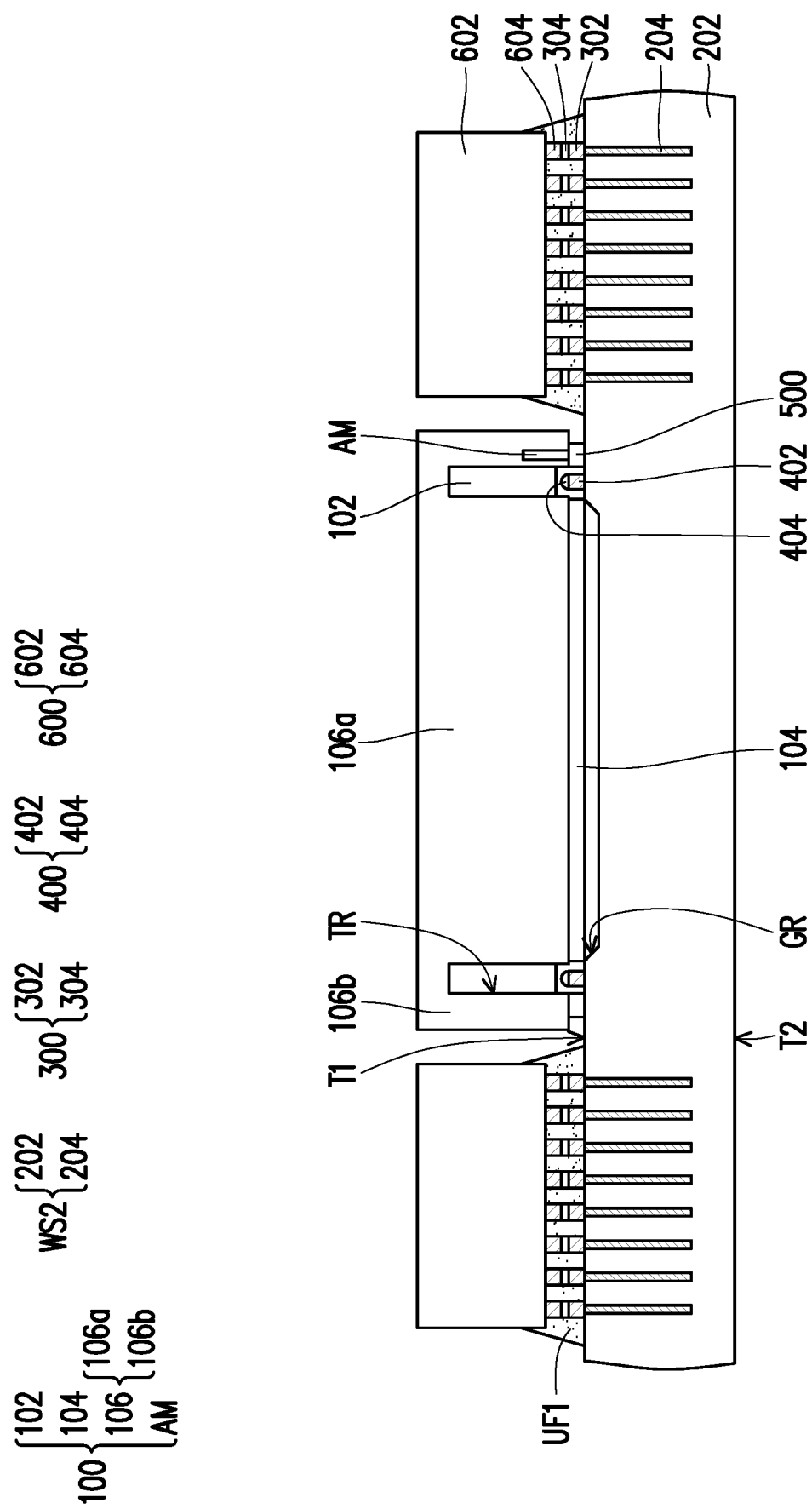

Referring to FIG. 1G, an underfill layer UF1 is formed between the dies 600 and the wafer substrate WS2. For example, the underfill layer UF1 may be formed to wrap around the conductive pads 604 of the dies 600 and the connectors 300 to protective these elements. In some embodiments, the underfill layer UF1 not only protects the conductive pads 604 and the connectors 300 from fatigue but also enhances bonding reliability between the dies 600 and the wafer substrate WS2. In some embodiments, the underfill layer UF1 may be optional.

Figure 1H:
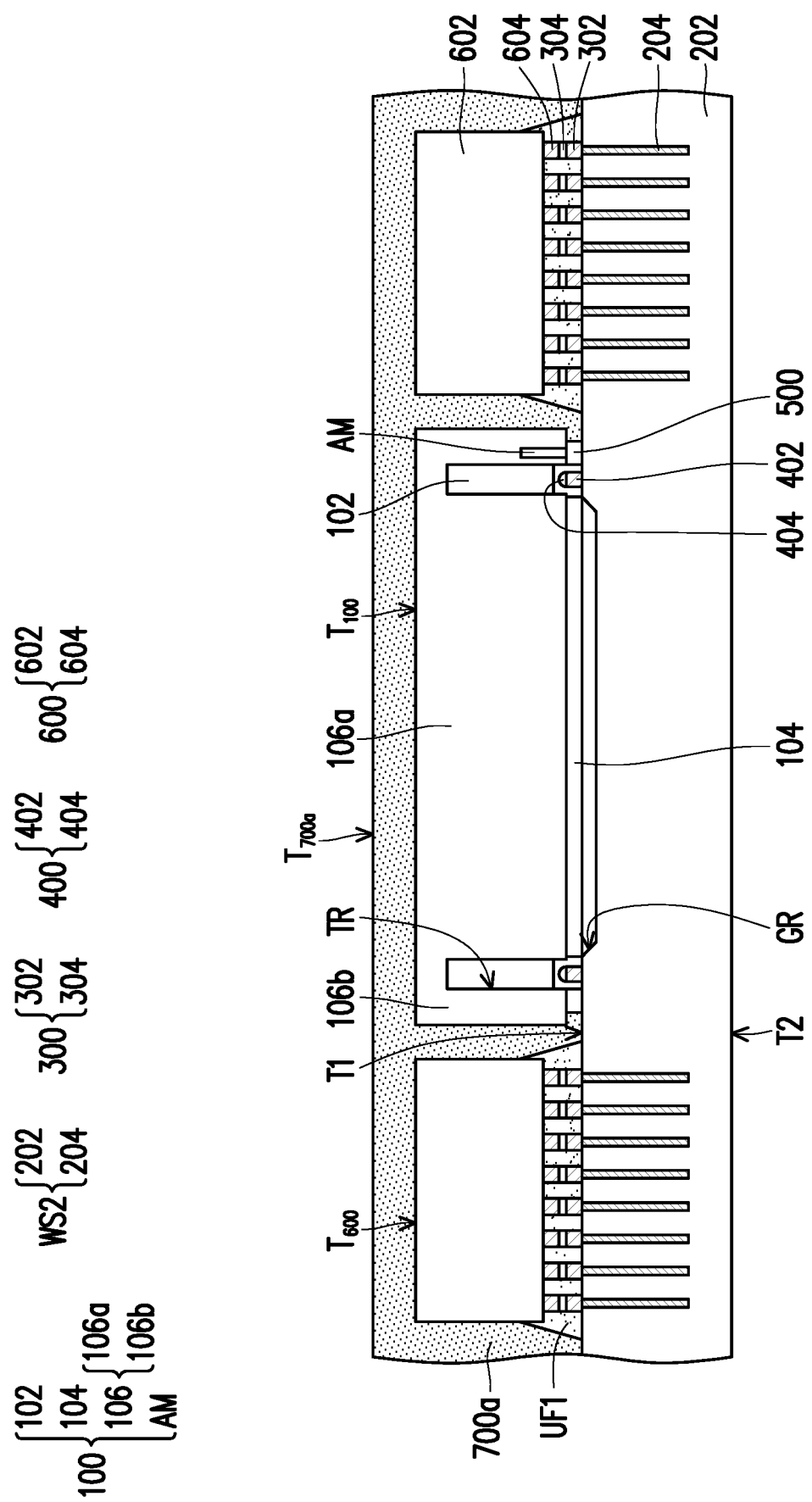

Referring to FIG. 1H, an encapsulation material 700a is formed on the wafer substrate WS2 to encapsulate the dummy die 100, the dies 600, the underfill layer UF1, and the adhesive layer 500. In some embodiments, the encapsulation material 700a is a molding compound, a molding underfill, a resin (such as epoxy), or the like. In some embodiments, the encapsulation material 700a includes fillers. The fillers may be particles made of silica, aluminum dioxide, or the like. The encapsulation material 700a may be formed by a molding process, such as a compression molding process. In some embodiments, the dummy die 100 and the dies 600 are completely encapsulated by the encapsulation material 700a. For example, a top surface $T_{700a}$ of the encapsulation material 700a is located at a level height higher than a top surface $T_{100}$ of the dummy die 100 and top surfaces $T_{600}$ of the dies 600. In other words, the dummy die 100 and the dies 600 are not revealed and are well protected by the encapsulation material 700a. As illustrated in FIG. 1F, the grooves GR of the wafer substrate WS2 are sealed by the dummy die 100, the dam structure 400, and the adhesive layer 500, so the encapsulation material 700a does not fill into the grooves GR.

Figure 1I:
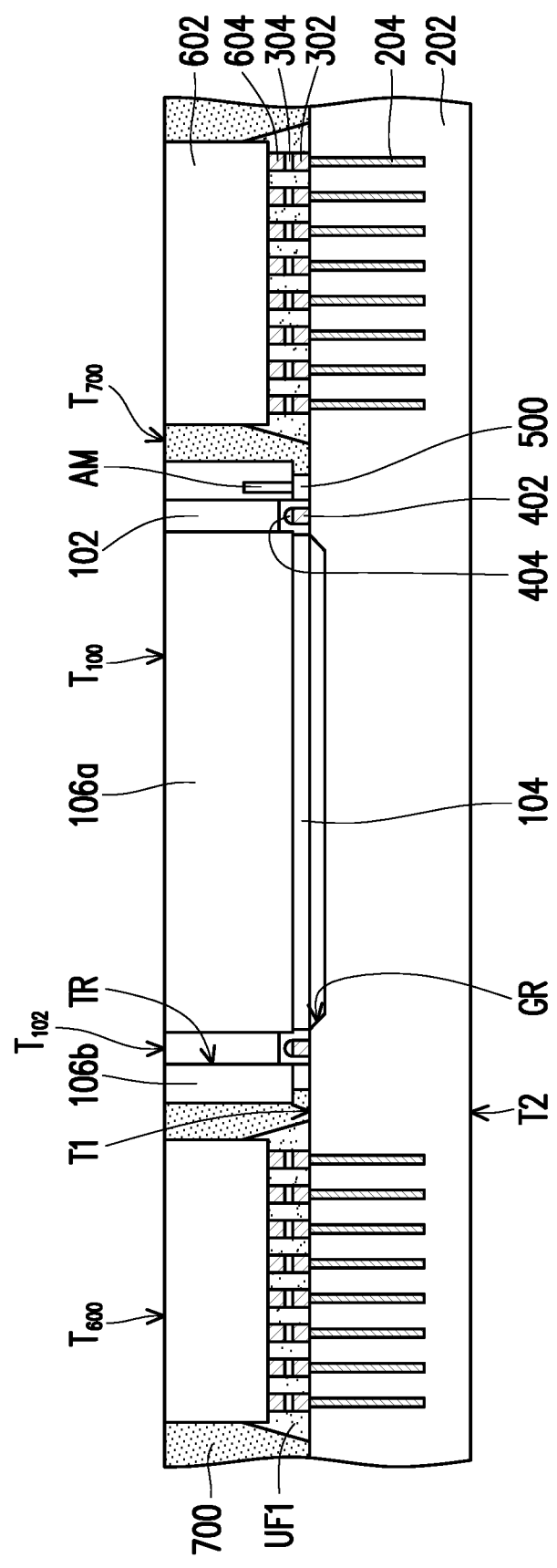

Referring to FIG. 1H and FIG. 1I, a portion of the encapsulation material 700a is removed until the dummy die 100 and the dies 600 are reveled. After the dummy die 100 and the dies 600 are revealed, a thickness of the dummy die 100, thicknesses of the dies 600, and a thickness of the encapsulation material 700a are further reduced until the dummy ring 102 filled in the trench TR of the dummy die 100 is revealed. In some embodiments, portions of the encapsulation material 700a, portions of the dummy die 100, and portions of the dies 600 may be removed through a grinding process, such as a mechanical grinding process, a chemical mechanical polishing (CMP) process, or another suitable mechanism. After the encapsulation material 700a is grinded, an encapsulant 700 is formed over the wafer substrate WS2 to laterally encapsulate the dummy die 100 and the dies 600. After the grinding process, a top surface $T_{102}$ of the dummy ring 102, a top surface $T_{700}$ of the encapsulant 700, the top surface $T_{100}$ of the dummy die 100, and the top surface $T_{600}$ of the dies 600 are substantially coplanar. As illustrated in FIG. 1I, after the grinding process, the trench TR penetrates through the dummy die 100. At this stage, the inner portion 106a and the outer portion 106b of the semiconductor substrate 106 of the dummy die 100 are separated from each other. For example, the dummy ring 102 is sandwiched between the inner portion 106a and the outer portion 106b of the semiconductor substrate 106 of the dummy die 100 to separate the inner portion 106a and the outer portion 106b.

Figure 1J:
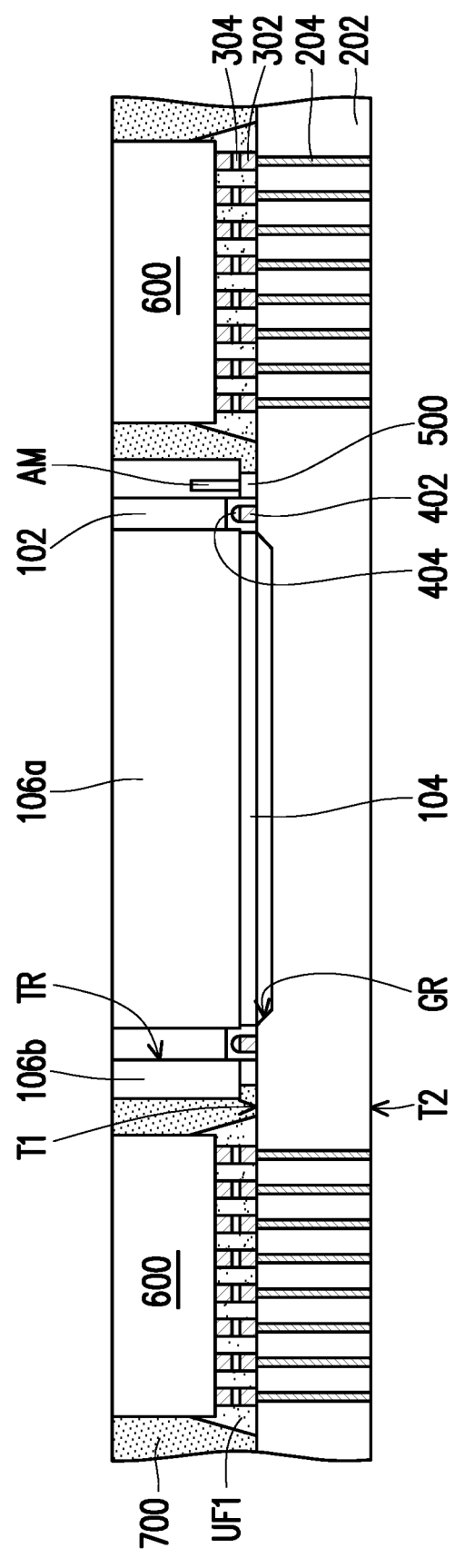

Referring to FIG. 1I and FIG. 1J, a planarization process is performed on the second surface T2 of the wafer substrate WS2. In some embodiments, the planarization process includes a mechanical grinding process and/or a CMP process. In some embodiments, the semiconductor substrate 202 is planarized until the TSVs 204 are revealed. For example, after the planarization process, the TSVs 204 penetrate through the semiconductor substrate 202. The TSVs 204 allow electrical communication between the front side and the back side of the wafer substrate WS2. In some embodiments, after the TSVs 204 are revealed, the wafer substrate WS2 may be further grinded to reduce the overall thickness thereof.

Figure 1K:
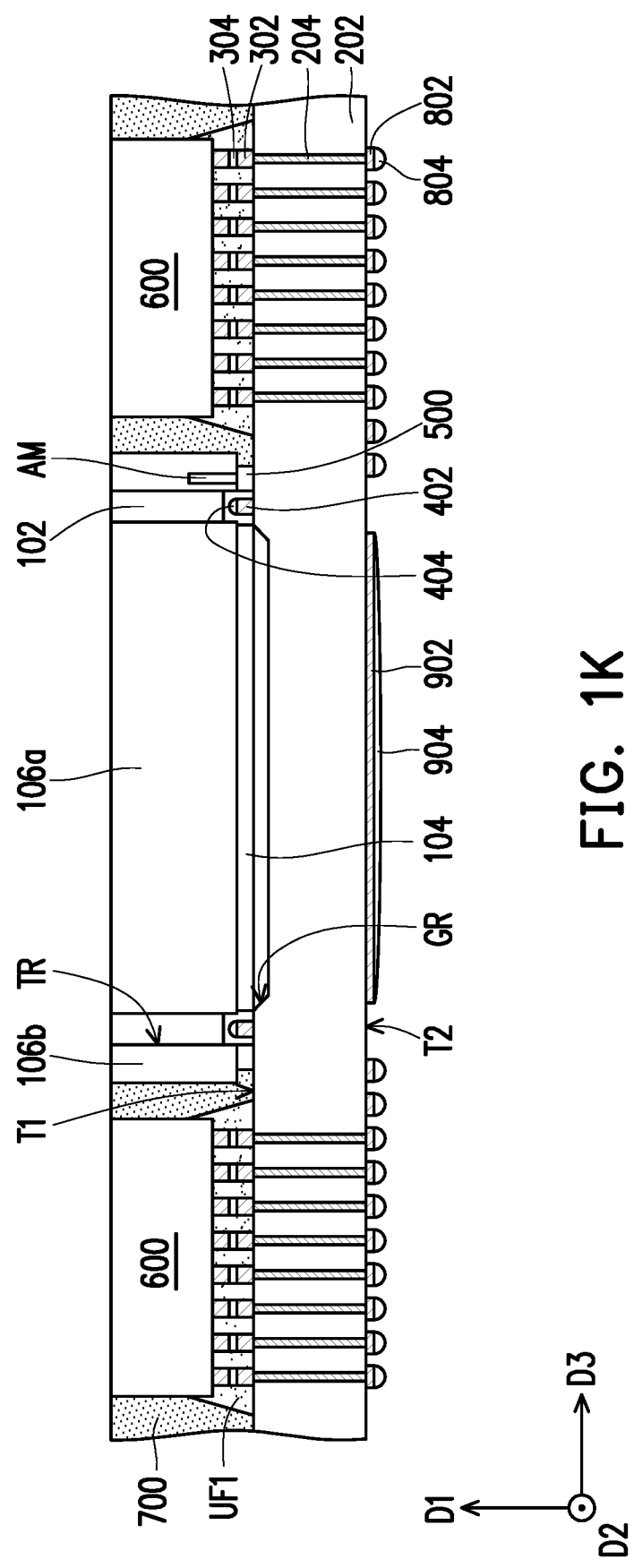

Referring to FIG. 1K, a plurality of conductive terminals 800 and a reinforcement structure 900 are formed on the second surface T2 of the wafer substrate WS2. In some embodiments, each conductive terminal 800 includes a conductive pillar 802 and a conductive bump 804 disposed on the conductive pillar 802. In some embodiments, the conductive terminals 800 are referred to as "controlled collapse chip connection (C4) bumps." In some embodiments, at least some of the conductive terminals 800 are disposed corresponding to the TSVs 204. In some embodiments, the conductive terminals 800 may be formed by the following steps. First, a seed layer (not shown) is blanketly formed over the second surface T2 of the wafer substrate WS2. The seed layer may be formed through, for example, a sputtering process, a PVD process, or the like. In some embodiments, the seed layer may include, for example, copper, titanium-copper alloy, or other suitable choice of materials. Subsequently, a photoresist pattern layer (not shown) is formed over the seed layer. The photoresist pattern layer has openings exposing portions of the seed layer. Thereafter, a conductive material (not shown) and a solder material (not shown) are sequentially deposited onto the exposed seed layer. That is, the conductive material and the solder material are located within the openings of the photoresist pattern layer. In some embodiments, the conductive material and the solder material may be formed by a plating process. The plating process is, for example, electroplating, electroless-plating, immersion plating, or the like. In some embodiments, the conductive material includes, for example, copper, copper alloys, or the like. After the conductive material and the solder material are formed, the photoresist pattern layer is removed. Upon removal of the photoresist pattern layer, portions of the seed layer, which are not covered by the conductive material and the solder material, are exposed. In some embodiments, the photoresist pattern layer may be removed/stripped through, for example, etching, ashing, or other suitable removal processes. Then, the seed layer that is not covered by the conductive material and the solder material is removed. The exposed portions of the seed layer may be removed through an etching process. In some embodiments, the remaining seed layer and the conductive material constitute the conductive pillars 802. Thereafter, a reflow process is performed on the solder material to transform the solder material into the conductive bumps 804. In some embodiments, the conductive terminals 800 are arranged in an array.

As illustrated in FIG. 1K, a portion of the reinforcement structure 900 is formed to vertically align with the grooves GR of the wafer substrate WS2. For example, a portion of the reinforcement structure 900 is located directly underneath the grooves GR. That is, a projection of the grooves GR along a direction D1 perpendicular to the first surface T1 of the wafer substrate WS2 is overlapped with a portion of the reinforcement structure 900. As illustrated in FIG. 1K, the reinforcement structure 900 is surrounded by the conductive terminals 800. In some embodiments, the reinforcement structure 900 includes a base pattern 902 and a protrusion 904 disposed on the base pattern 902. In some embodiments, the conductive terminals 800 and the reinforcement structure 900 may be formed simultaneously. For example, the conductive pillars 802 of the conductive terminals 800 and the base pattern 902 of the reinforcement structure 900 may be formed by the same process step. On the other hand, the conductive bumps 804 of the conductive terminals 800 and the protrusion 904 of the reinforcement structure 900 may also be formed by the same process step. That is, the conductive terminals 800 and the reinforcement structure 900 are made of the same material. In some embodiments, a material of the conductive pillars 802 of the conductive terminals 800 and a material of the base pattern 902 of the reinforcement structure 900 are the same, and a material of the conductive bumps 804 of the conductive terminals 800 and a material of the protrusion 904 of the reinforcement structure 900 are the same. For example, both of the conductive pillars 802 and the base pattern 902 are made of a conductive material. However, the disclosure is not limited thereto. In some alternative embodiments, the conductive terminals 800 and the reinforcement structure 900 may be formed in separate steps. For example, the conductive terminals 800 may be formed by a conductive material while the reinforcement structure 900 may be made of a dielectric material (such as polyimide, epoxy resin, acrylic resin, phenol resin, BCB, PBO, or the like).

In some embodiments, a size of the reinforcement structure 900 is larger than a size of each conductive terminal 800. For example, each conductive terminal 800 has a diameter ranging from about 50 micrometers to about 200 micrometers. On the other hand, the reinforcement structure 900 has a length or a width ranging from about 1 millimeter to about 200 millimeters. As illustrated in FIG. 1K, a height of each conductive terminal 800 is greater than a height of the reinforcement structure 900. However, the disclosure is not limited thereto. In some alternative embodiments, the height of each conductive terminal 800 may be substantially equal to the height of the reinforcement structure 900. The relative configuration of the reinforcement structure 900 and the grooves GR will be discussed in greater detail later in conjunction with FIG. 1O, FIGS. 2A-2B, and FIGS. 3A-3B.

In some embodiments, a redistribution structure (not shown) may be formed on the second surface T2 of the wafer substrate WS2. That is, the redistribution structure may be optionally formed between the wafer substrate WS2 and the conductive terminals 800 and between the wafer substrate WS2 and the reinforcement structure 900. In some embodiments, the redistribution structure includes a plurality of dielectric layers (not shown) and a plurality of redistribution conductive layers (not shown) stacked alternately. In some embodiments, the redistribution structure electrically connects the TSVs 204 and the conductive terminals 800 while redistributing the routing of the electrical path.

Figure 1L:
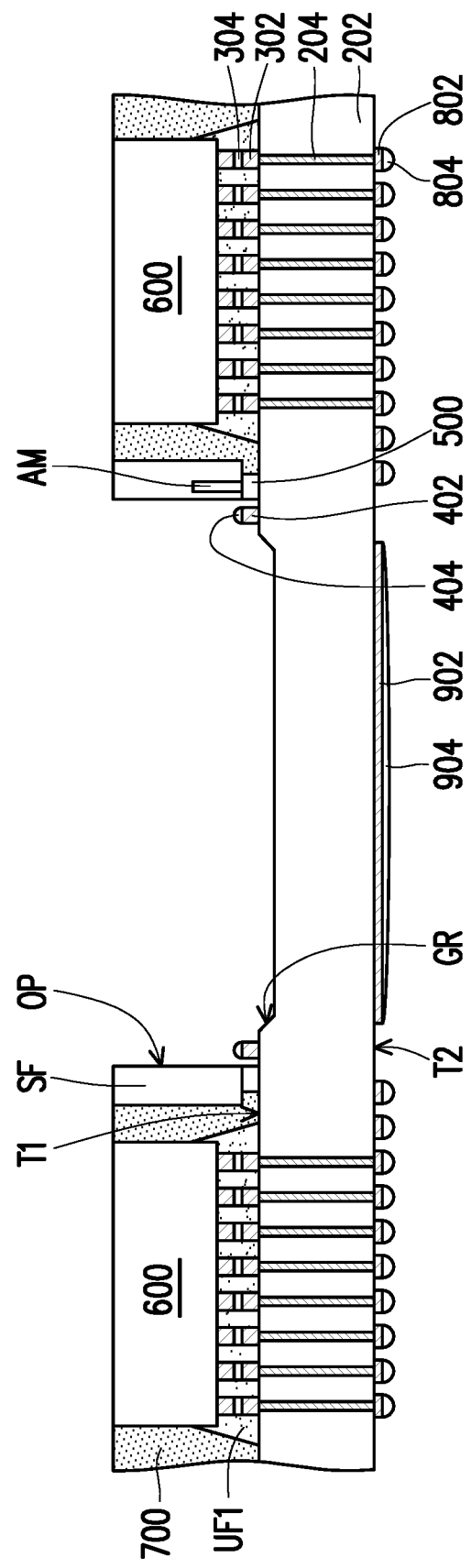

Referring to FIG. 1K and FIG. 1L, a portion of the dummy die 100 is removed. For example, the inner portion 106a of the semiconductor substrate 106 and the dummy ring 102 are removed. In some embodiments, the inner portion 106a is removed through the following steps. First, a cutting process is performed on the exposed dummy ring 102. In some embodiments, the cutting process may include a laser drilling process, a mechanical drilling process, a combination thereof, or any other suitable dicing processes. In some embodiments, the dummy ring 102 is completely removed during the cutting process. However, the disclosure is not limited thereto. In some alternative embodiments, the dummy ring 102 is partially removed during the cutting process. For example, the dummy ring 102 may be cut through such that a portion of the dummy ring 102 remains on the sidewalls of the outer portion 106b of the semiconductor substrate 106 while another portion of the dummy ring 102 remains on the sidewalls of the inner portion 106a of the semiconductor substrate 106. After the cutting process, the inner portion 106a and the outer portion 106b are disconnected from each other. Subsequently, the inner portion 106a is removed. On the other hand, the remaining outer portion 106b forms a semiconductor frame SF having an opening OP. In some embodiments, the semiconductor frame SF is electrically floating. As illustrated in FIG. 1L, the opening OP of the semiconductor frame SF exposes the dam structure 400 and the grooves GR.

Figure 1M:
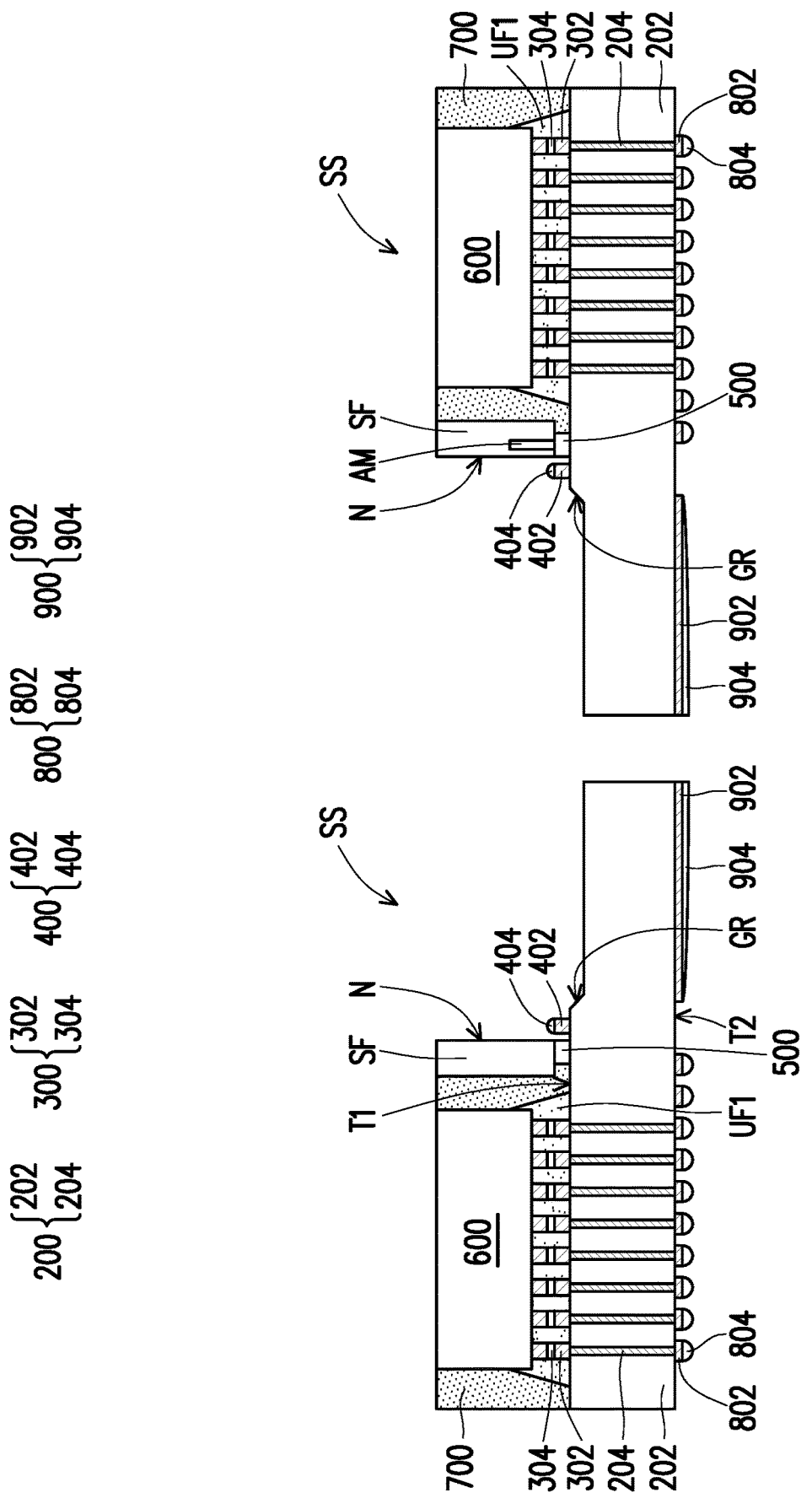

Referring to FIG. 1L and FIG. 1M, a singulation process is performed on the structure illustrated in FIG. 1L to form a plurality of singulated structure SS. That is, the semiconductor frame SF, the wafer substrate WS2, and the reinforcement structure 900 are singulated. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, a thickness of the semiconductor wafer WS2 is not uniform. For example, the regions being occupied by the grooves GR have smaller thicknesses as compared to the regions not being occupied by the grooves GR. Therefore, during singulation of the wafer substrate WS2, stress may be generated at the regions being occupied by the grooves GR, thereby causing crack in the wafer substrate WS2. However, as mentioned above, since the reinforcement structure 900 is aligned with the grooves GR, the deficiencies in thicknesses of the regions occupied by the grooves GR may be compensated by the reinforcement structure 900. As such, with the presence of the reinforcement structure 900, the crack issue in the wafer substrate WS2 during the singulation process may be alleviated, thereby enhancing the yield and reliability of the subsequently formed packages.

In some embodiments, during the singulation process, the wafer substrate WS2 is divided into a plurality of dies 200. As illustrated in FIG. 1M, each die 200 includes the semiconductor substrate 202 and the TSVs 204 embedded in the semiconductor substrate 202. The die 200 has a first surface T1 and a second surface T2 opposite to the first surface T1. In some embodiments, the die 200 includes grooves GR on the first surface T1. As illustrated in FIG. 1M, the die 600 and the semiconductor frame SF are disposed side by side over the first surface T1 of the die 200. In addition, the encapsulant 700 is disposed over the first surface T1 of the die 200 to laterally encapsulate the die 600. Moreover, the dam structure 400 is also disposed on the first surface T1 of the die 200. In some embodiments, the semiconductor frame SF has a notch N exposing the dam structure 400 and the grooves GR. In some embodiments, the dam structure 400 is disposed along edges of the notch N (shown in FIG. 2A). In some embodiments, the conductive terminals 800 and the reinforcement structure 900 are disposed on the second surface T2 of the die 200. As illustrated in FIG. 1M, at this stage, the protrusion 904 of the reinforcement structure 900 has a substantially straight sidewall along the cutting line. That is, one of the sidewalls of the protrusion 904 of the reinforcement structure 900 is aligned with a sidewall of the die 200.

Figure 1N:
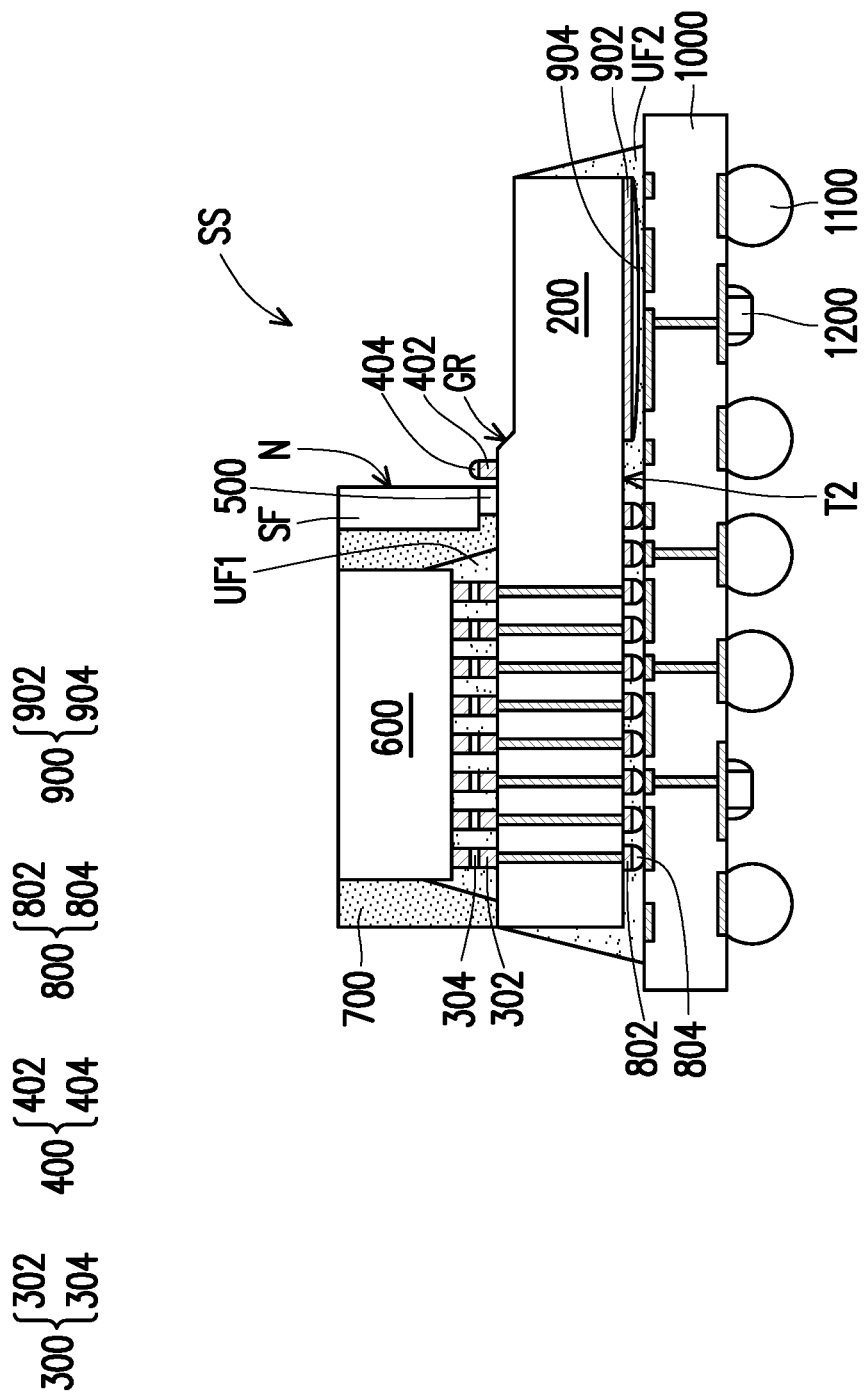
Figure 10:
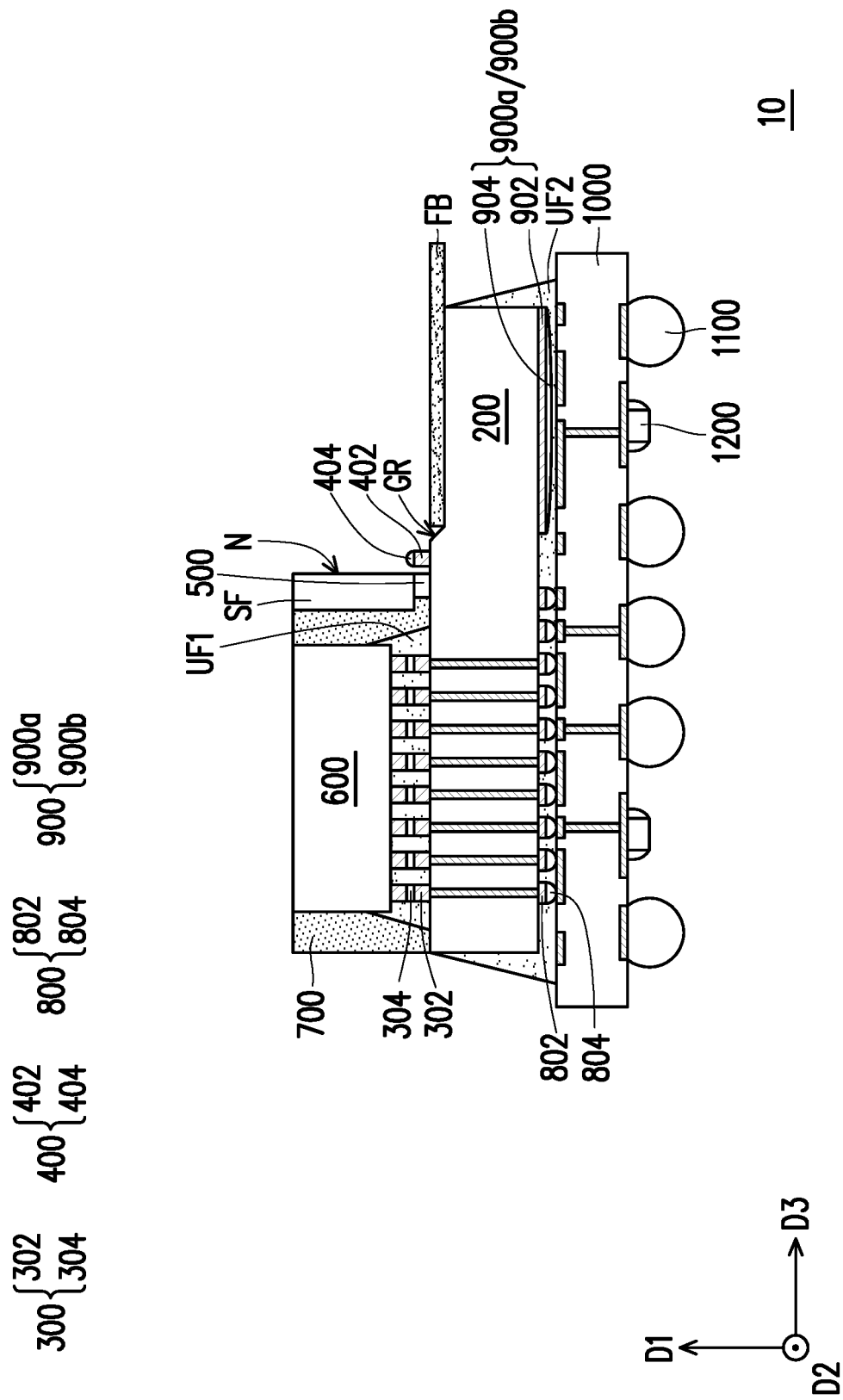

Referring to FIG. 1N, the singulated structure SS illustrated in FIG. 1M is mounted onto a circuit substrate 1000. In some embodiments, the singulated structure SS is mounted such that the circuit substrate 1000 is over the second surface T2 of the die 200. In some embodiments, the circuit substrate 1000 includes a printed circuit board (PCB) or the like. In some embodiments, after the singulated structure SS is attached to the circuit substrate 1000, a reflow process is performed on the conductive terminals 800 and the reinforcement structure 900 to reshape the reinforcement structure 900. In other words, during the reflow process, rounding of the protrusion 904 of the reinforcement structure 900 would occur. After the reflow process, the sidewalls of the protrusion 904 are no longer aligned with the sidewalls of the die 200. In some embodiments, the conductive terminals 800 of the singulated structure SS are electrically connected to the wiring of the circuit substrate 1000. For example, the conductive terminals 800 of the singulated structure SS are directly in contact with the circuit substrate 1000 to render electrical connection. On the other hand, the reinforcement structure 900 is electrically insulated from the circuit substrate 1000. As mentioned above, the height of each conductive terminal 800 is greater than the height of the reinforcement structure 900. As such, when the conductive terminals 800 abut the circuit substrate 1000, the reinforcement structure 900 is spaced apart from the circuit substrate 1000. As a result, the reinforcement structure 900 is electrically insulated from the circuit substrate 1000. However, the disclosure is not limited thereto. In some alternative embodiments, the height of each conductive terminal 800 is substantially equal to the height of the reinforcement structure 900. As such, both of the conductive terminals 800 and the reinforcement structure 900 would be directly in contact with the circuit substrate 1000. Nevertheless, under this scenario, the reinforcement structure 900 would not be in direct contact with the wiring of the circuit substrate 1000. As a result, the reinforcement structure 900 is still electrically insulated from the circuit substrate 1000. In some embodiments, the reinforcement structure 900 is electrically floating.

In some embodiments, an underfill UF2 may be optionally formed on the circuit substrate 1000 to laterally encapsulate the die 200, the conductive terminals 800, and the reinforcement structure 900. In some embodiments, the underfill UF2 may be utilized to protect these elements.

As illustrated in FIG. 1N, a plurality of conductive terminals 1100 and a plurality of devices 1200 are formed on the circuit substrate 1000 opposite to the singulated structure SS. In some embodiments, the conductive terminals 1100 are solder balls, ball grid array (BGA) balls, or the like. In some embodiments, the conductive terminals 1100 are made of a conductive material with low resistivity, such as Sn, Pb, Ag, Cu, Ni, Bi, or an alloy thereof. In some embodiments, the devices 1200 may include passive components, such as resistors, capacitors, inductors, or the like.

Referring to FIG. 1O, optical fibers FB are placed in the grooves GR to form the package 10. In some embodiments, the optical fibers FB are laterally inserted into the grooves GR. The optical fibers FB extend laterally along the grooves GR and are optically coupled to the optical devices of the die 200. In some embodiments, the package structure 10 illustrated in FIG. 1O may be referred to as a "CoWoS (Chip on Wafer on Substrate) package." As illustrated in FIG. 1O, the die 200 is sandwiched or interposed between the die 600 and the circuit substrate 1000. Therefore, in some embodiments, the die 200 may be referred to as an "interposer."

The relative configuration of the reinforcement structure 900 and the grooves GR will be discussed below in conjunction with FIG. 1O, FIGS. 2A-2B, and FIGS. 3A-3B.

Figure 2A:
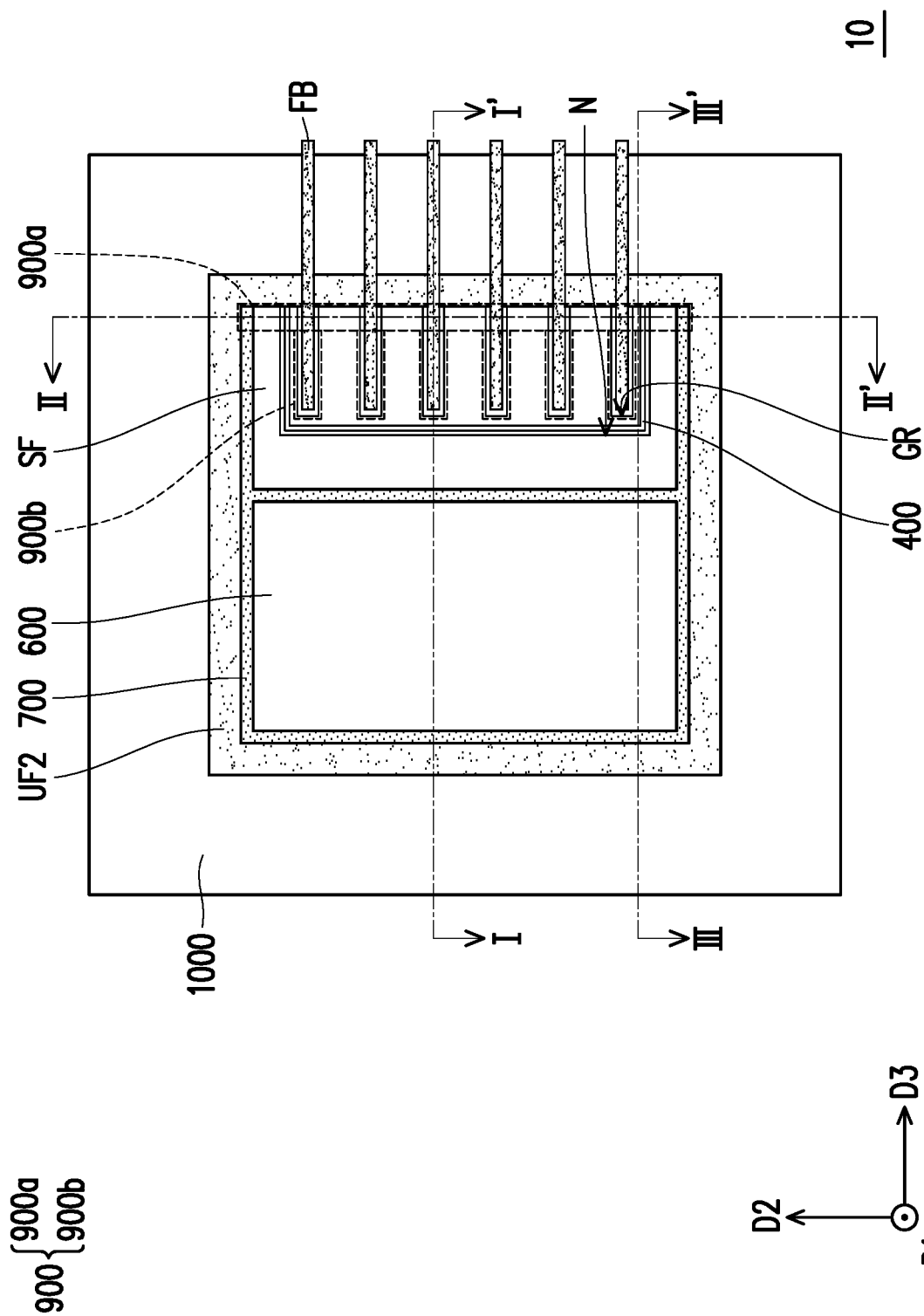
FIG. 2A is a top view of the package in FIG. 1O.
Figure 2B:
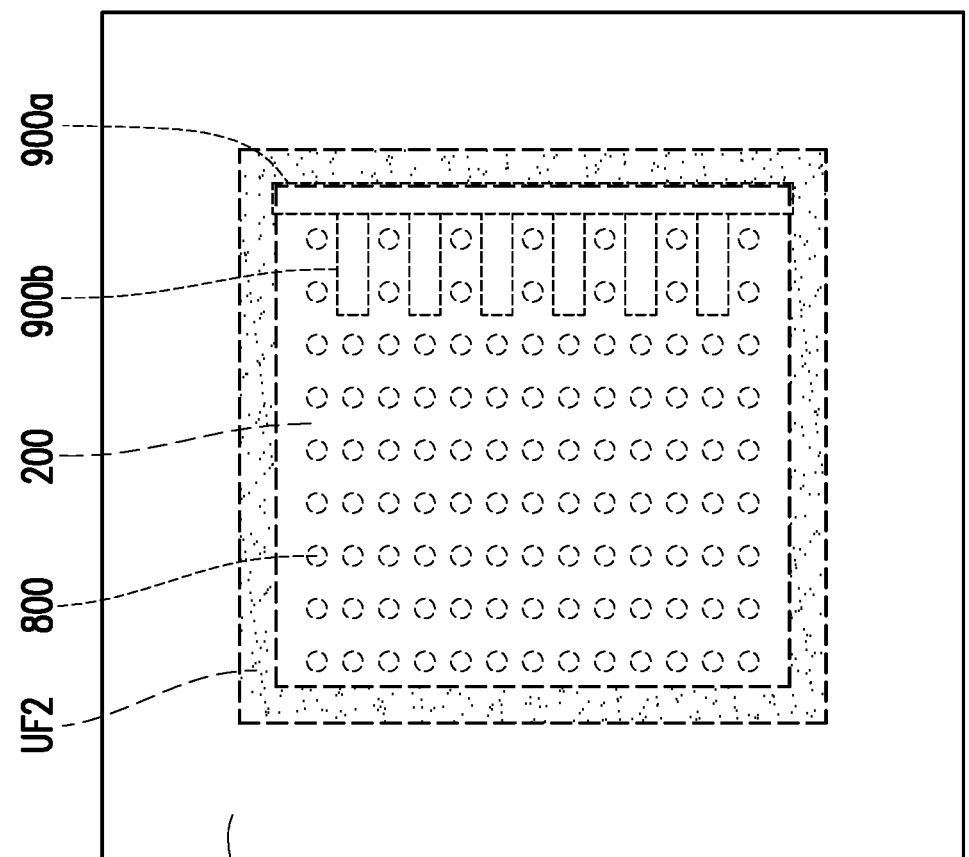
FIG. 2B is a bottom view of the package in FIG. 1O.
Figure 3A:
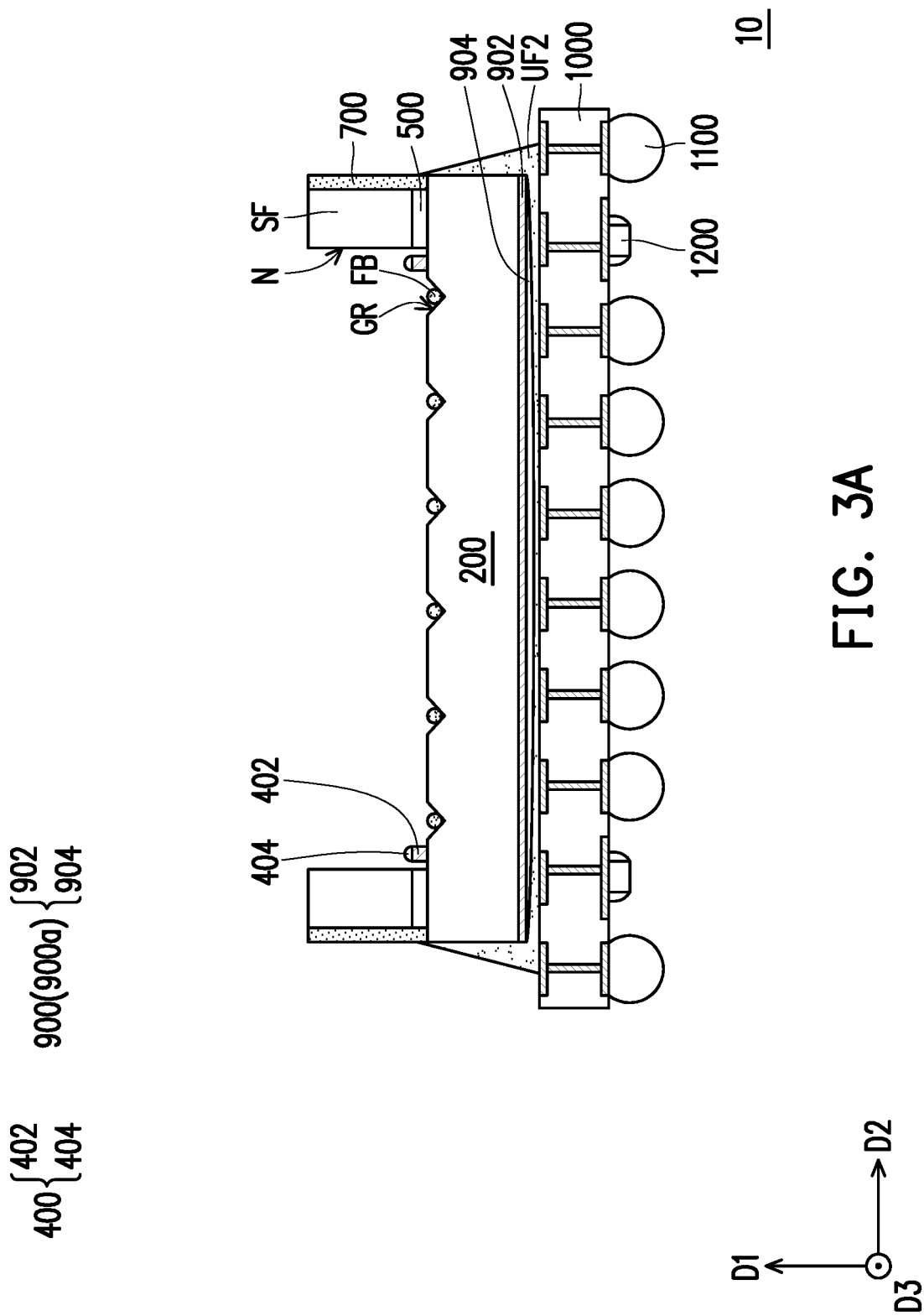
FIG. 3A is a schematic cross-sectional view of the package in FIG. 2A taken along line II-II'.
Figure 3B:
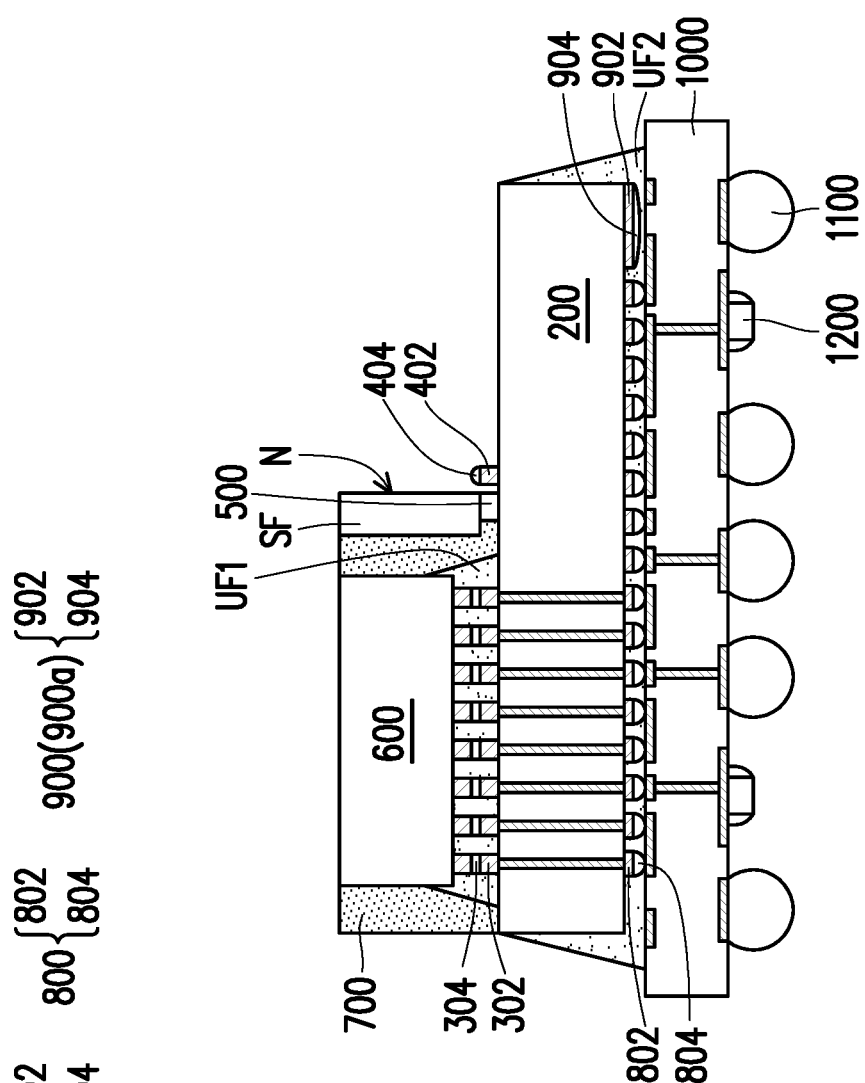
FIG. 3B is a schematic cross-sectional view of the package in FIG. 2A taken along line III-III'.

FIG. 2A is a top view of the package 10 in FIG. 1O. FIG. 2B is a bottom view of the package 10 in FIG. 1O. FIG. 3A is a schematic cross-sectional view of the package 10 in FIG. 2A taken along line II-II'. FIG. 3B is a schematic cross-sectional view of the package 10 in FIG. 2A taken along line III-III'. It should be noted that FIG. 1O is a schematic cross-sectional view of the package 10 in FIG. 2A taken along line I-I'. Moreover, for simplicity, the conductive terminals 1100 and the devices 1200 are omitted in FIG. 2B. Referring to FIG. 1O, FIGS. 2A-2B, and FIGS. 3A-3B, the reinforcement structure 900 includes a trunk portion 900a and a plurality of branch portions 900b extending out from the trunk portion 900a. In some embodiments, the dotted line denoting the trunk portion 900a and the branch portions 900b in FIGS. 2A-2B may correspond to the shape or the contour of the base pattern 902 of the reinforcement structure 900. In some embodiments, the branch portions 900b are connected to the trunk portion 900a. For example, as shown in FIGS. 2A-2B, the reinforcement structure 900 exhibits a comb-shape from the top view. As illustrated in FIGS. 2A-2B, the trunk portion 900a extends along a direction D2 while the branch portions 900b extend along a direction D3 perpendicular to the direction D2. In some embodiments, the trunk portion 900a of the reinforcement structure 900 is disposed along an edge of the die 200.

As illustrated in FIG. 1O, FIGS. 2A-2B, and FIGS. 3A-3B, the branch portions 900b of the reinforcement structure 900 are aligned with the grooves GR from the top view. For example, the branch portions 900b of the reinforcement structure 900 are located directly underneath the grooves GR. That is, projections of the grooves GR along the direction D1 are overlapped with the branch portions 900b of the reinforcement structure 900. On the other hand, the trunk portion 900a may intersect with the grooves GR from the top view. That is, a portion of the trunk portion 900a of the reinforcement structure 900 is aligned with a portion of each groove GR from the top view. For example, a portion of the trunk portion 900a of the reinforcement structure 900 is located directly underneath the grooves GR. That is, projections of a portion of each groove GR along the direction D1 are overlapped with a portion of the trunk portion 900a of the reinforcement structure 900. Although FIG. 2A illustrated that a width of each branch portion 900b (i.e. a width of the base pattern 902 of the branch portion 900b) along the direction D2 is greater than a width of each grooves GR along the direction D2, the disclosure is not limited thereto. In some alternative embodiments, the width of each branch portion 900b (i.e. the width of the base pattern 902 of the branch portion 900b) along the direction D2 may be equal to a width of each grooves GR along the direction D2. That is, projections of the grooves GR along the direction D1 would match with the branch portions 900b.

In some embodiments, the branch portions 900b may be collectively referred to as a first portion of the reinforcement structure 900 while the trunk portion 900a may be referred to as a second portion of the reinforcement structure 900.

As illustrated in FIG. 2B, the conductive terminals 800 are arranged in an array. The trunk portion 900a is located adjacent to the array of the conductive terminals 800. In some embodiments, the branch portions 900b are aligned with some rows of the conductive terminals 800. On the other hand, the branch portions 900b are sandwiched between portions of other rows of the conductive terminals 800.

As illustrated in FIG. 1O and FIG. 3A, a thickness of the die 200 is not uniform. For example, the regions being occupied by the grooves GR have smaller thicknesses as compared to the regions not being occupied by the grooves GR. Therefore, during singulation of the wafer substrate WS2 (shown in FIG. 1M), stress may be generated at the regions being occupied by the grooves GR, thereby causing crack in the die 200. However, since the branch portions 900b of the reinforcement structure 900 are aligned with the grooves GR, the deficiencies in thicknesses of the regions occupied by the grooves GR may be compensated by the branch portions 900b. Moreover, since the trunk portion 900a is disposed along the cutting line during the singulation process, the trunk portion 900a may further enhance the structure rigidity against stress generated. As such, with the presence of the reinforcement structure 900, the crack issue in the die 200 derived from the singulation process may be alleviated, thereby enhancing the yield and reliability of the package 10.

Figure 4A:
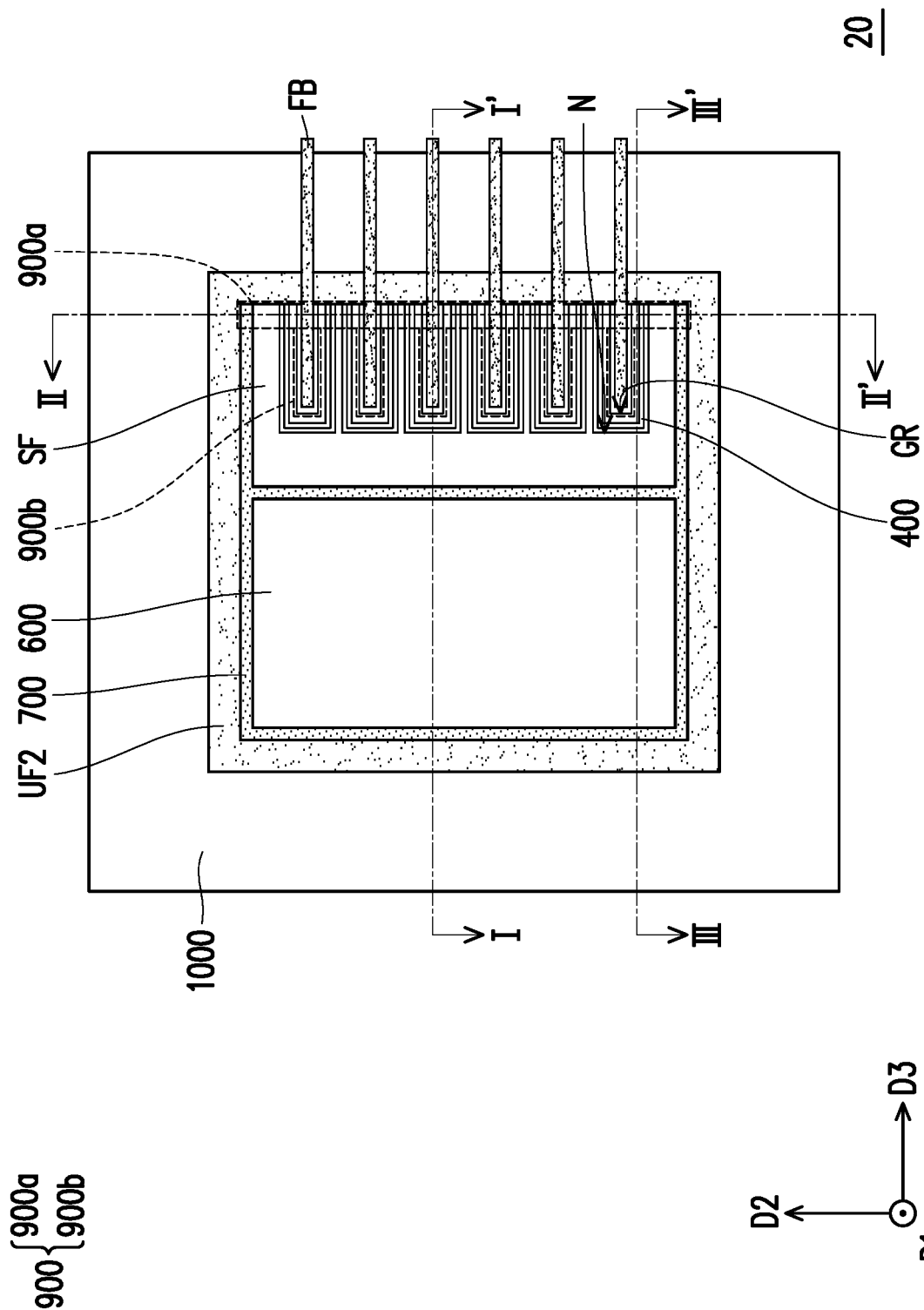
FIG. 4A is a top view of a package in accordance with some alternative embodiments of the disclosure.
Figure 4B:
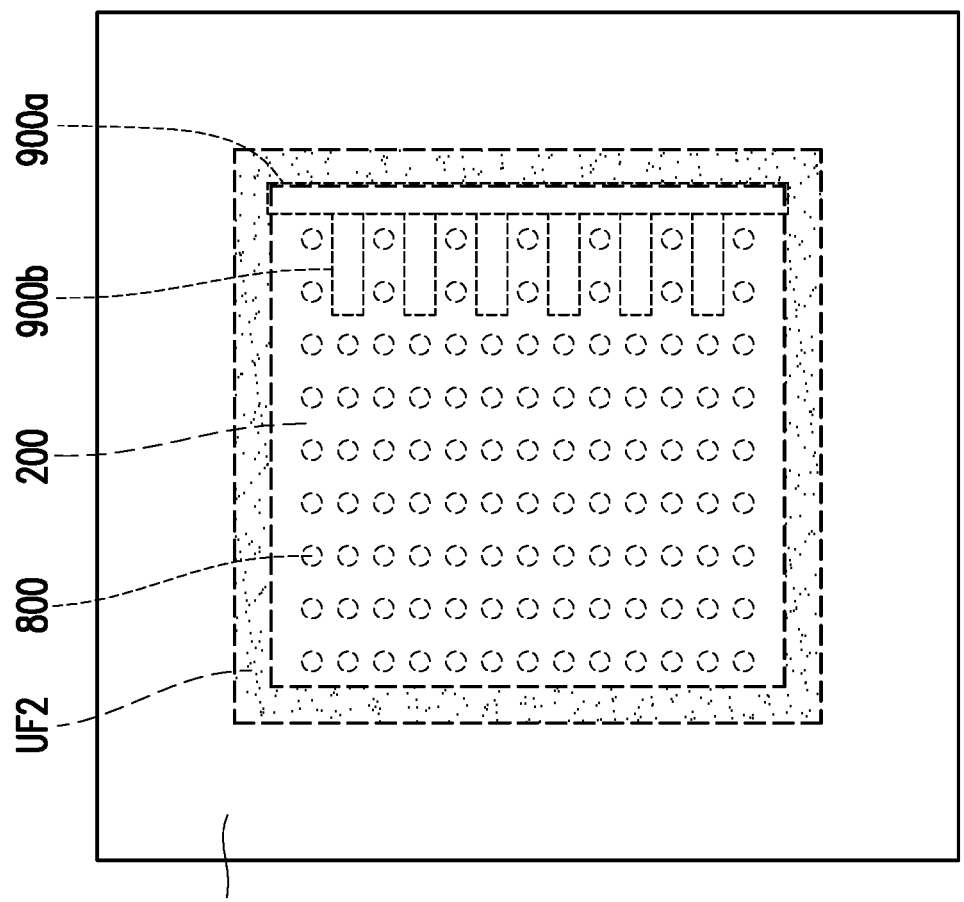
FIG. 4B is a bottom view of the package in FIG. 4A.
Figure 4B:
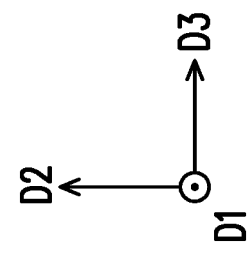
Figure 5A:
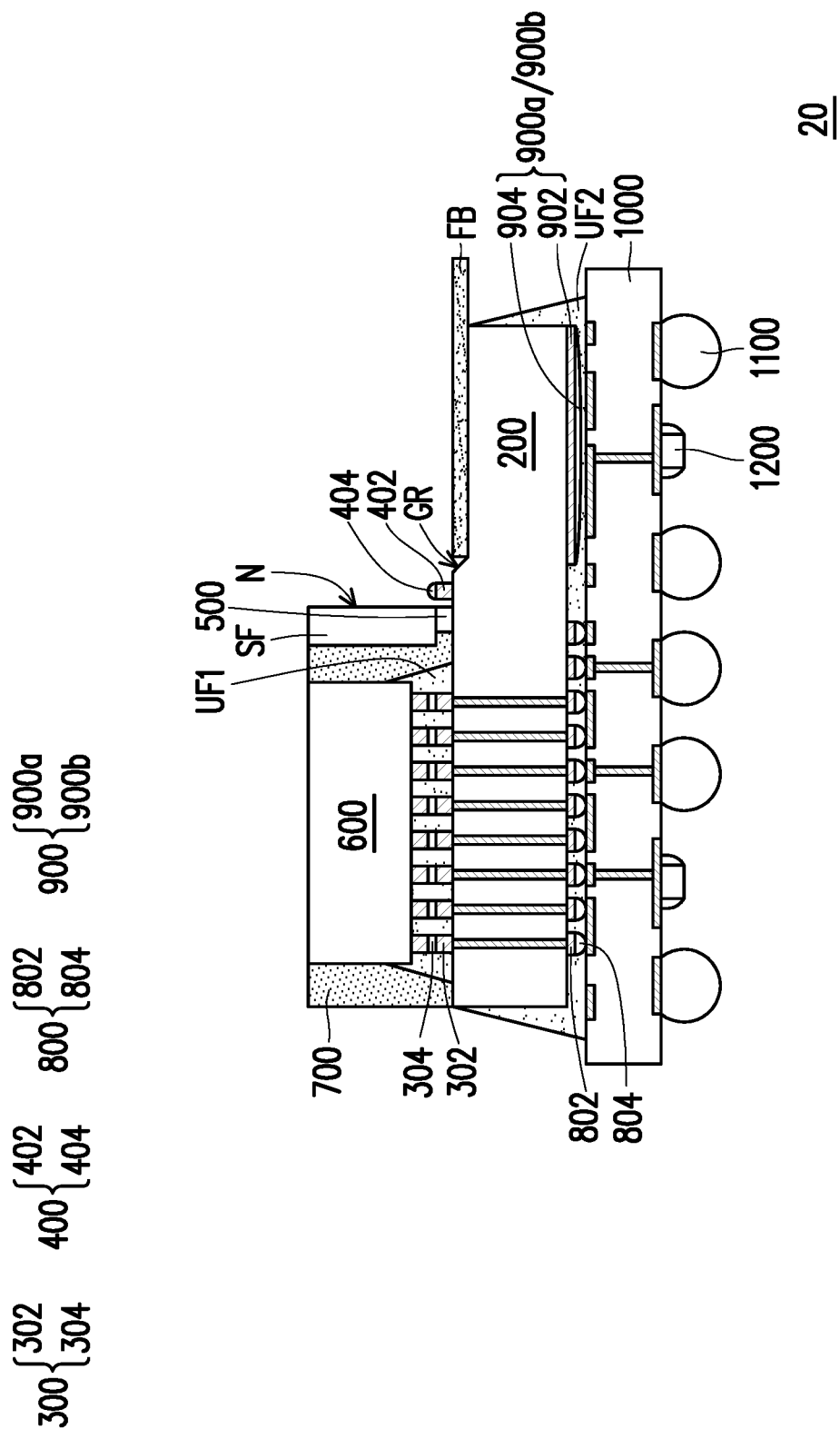
FIG. 5A is a schematic cross-sectional view of the package in FIG. 4A taken along line I-I'.
Figure 5B:
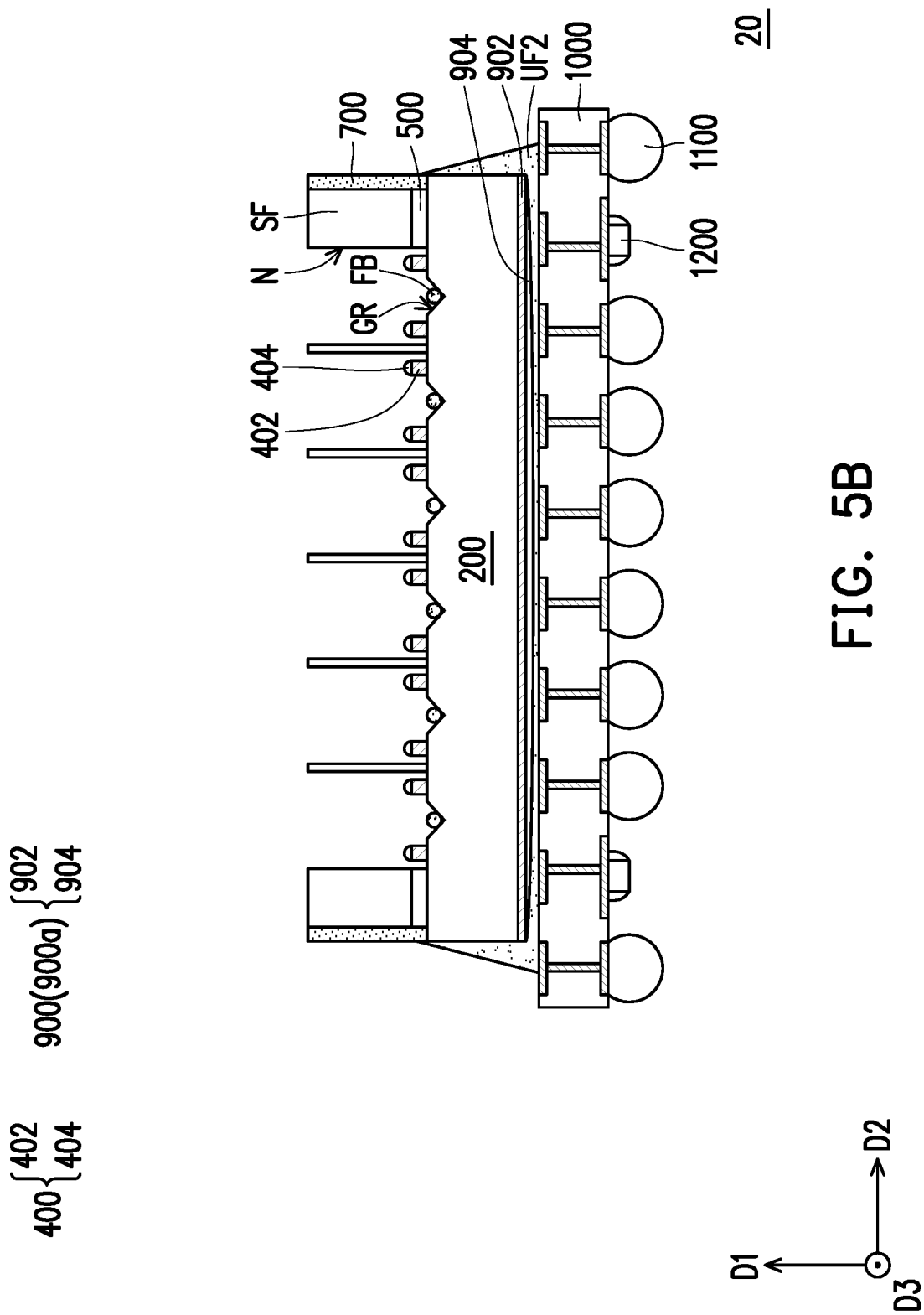
FIG. 5B is a schematic cross-sectional view of the package in FIG. 4A taken along line II-II'.
Figure 5C:
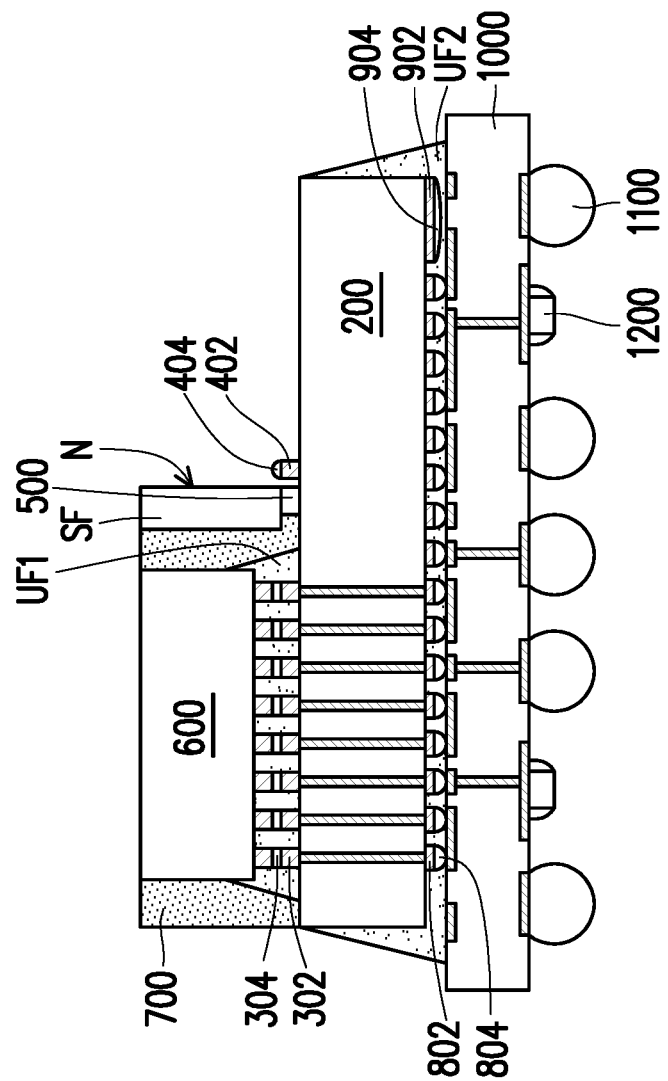
FIG. 5C is a schematic cross-sectional view of the package in FIG. 4A taken along line III-III'.

FIG. 4A is a top view of a package 20 in accordance with some alternative embodiments of the disclosure. FIG. 4B is a bottom view of the package 20 in FIG. 4A. FIG. 5A is a schematic cross-sectional view of the package 20 in FIG. 4A taken along line I-I'. FIG. 5B is a schematic cross-sectional view of the package 20 in FIG. 4A taken along line II-II'. FIG. 5C is a schematic cross-sectional view of the package 20 in FIG. 4A taken along line III-III'. For simplicity, the conductive terminals 1100 and the devices 1200 are omitted in FIG. 4B. Referring to FIGS. 4A-4B and FIGS. 5A-5C, the package 20 in FIGS. 4A-4B and FIGS. 5A-5C is similar to the package 10 in FIG. 1O, FIGS. 2A-2B, and FIGS. 3A-3B, so similar elements are denoted by the same reference numeral and the detailed descriptions thereof are omitted herein. The difference between the package 10 in FIG. 2A and the package 20 in FIG. 4A lies in that in package 20, multiple notches N are formed in the semiconductor frame SF. Each notch N in the package 20 of FIG. 4A is smaller than the notch N in the package 10 of FIG. 2A. As illustrated in FIG. 4A, the number of the notches N corresponds to the number of the grooves GR. That is, each notch N accommodates one groove GR. Similar to that of the package 10, the reinforcement structure 900 of package 20 also includes a trunk portion 900a and a plurality of branch portions 900b extending out from the trunk portion 900a. As illustrated in FIGS. 4A-4B and FIGS. 5A-5C, the branch portions 900b of the reinforcement structure 900 are aligned with the grooves GR from the top view. On the other hand, the trunk portion 900a may intersect with the grooves GR from the top view.

As illustrated in FIG. 5A and FIG. 5B, a thickness of the die 200 is not uniform. For example, the regions being occupied by the grooves GR have smaller thicknesses as compared to the regions not being occupied by the grooves GR. Therefore, during singulation of the wafer substrate WS2 (shown in FIG. 1M), stress may be generated at the regions being occupied by the grooves GR, thereby causing crack in the die 200. However, since the branch portions 900b of the reinforcement structure 900 are aligned with the grooves GR, the deficiencies in thicknesses of the regions occupied by the grooves GR may be compensated by the branch portions 900b. Moreover, the smaller notches N in the package 20 allows less semiconductor material to be removed during the step shown in FIG. 1L, so the structure rigidity of the semiconductor frame SF may be sufficiently maintained. As a result, the warpage generated during the manufacturing process of the package 20 may be sufficiently suppressed. Furthermore, since the trunk portion 900a is disposed along the cutting line during the singulation process, the trunk portion 900a may further enhance the structure rigidity against stress generated. As such, with the presence of the reinforcement structure 900, the crack issue in the die 200 derived from the singulation process may be alleviated, thereby enhancing the yield and reliability of the package 20.

Figure 6A:
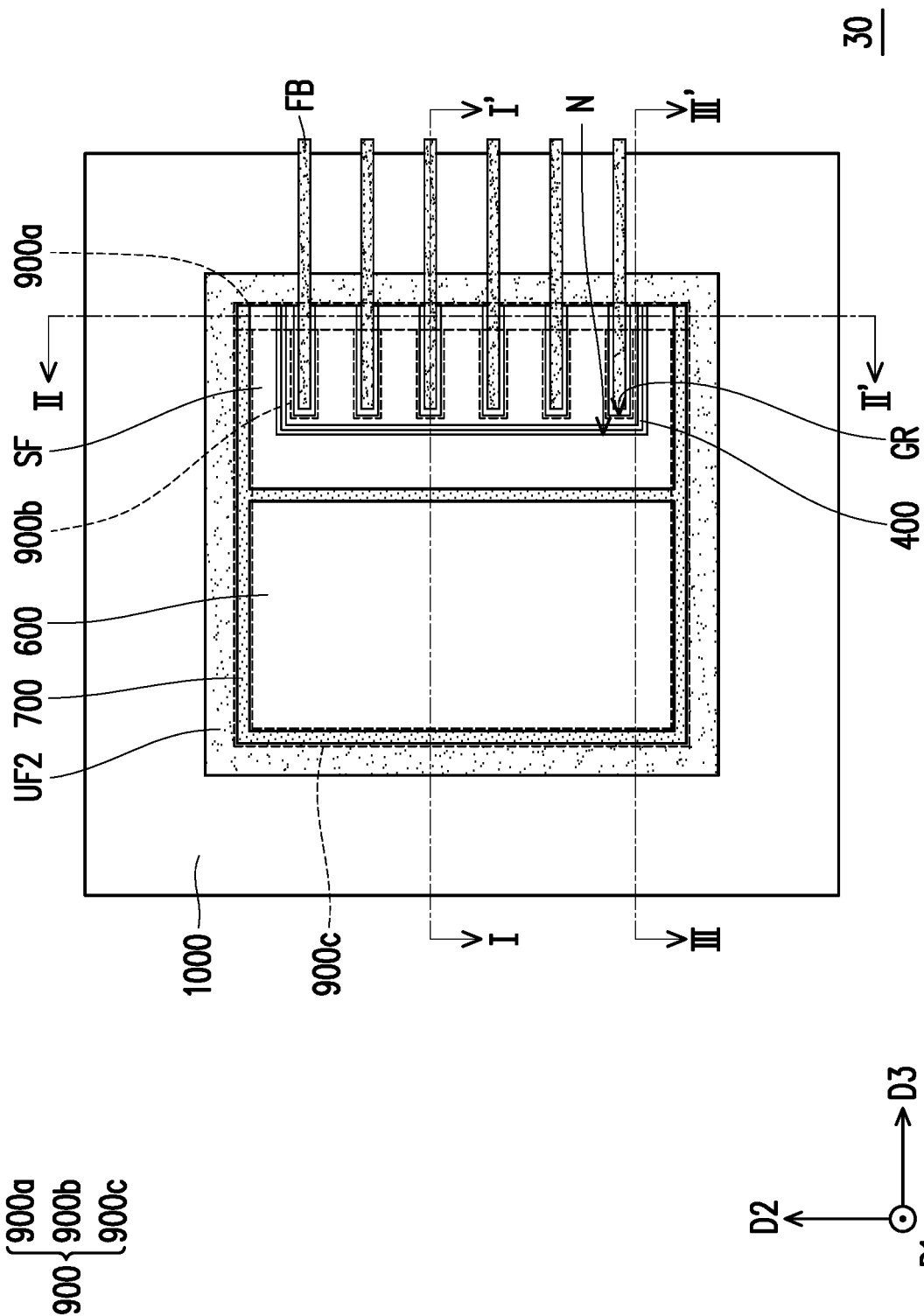
FIG. 6A is a top view of a package in accordance with some alternative embodiments of the disclosure.
Figure 6B:
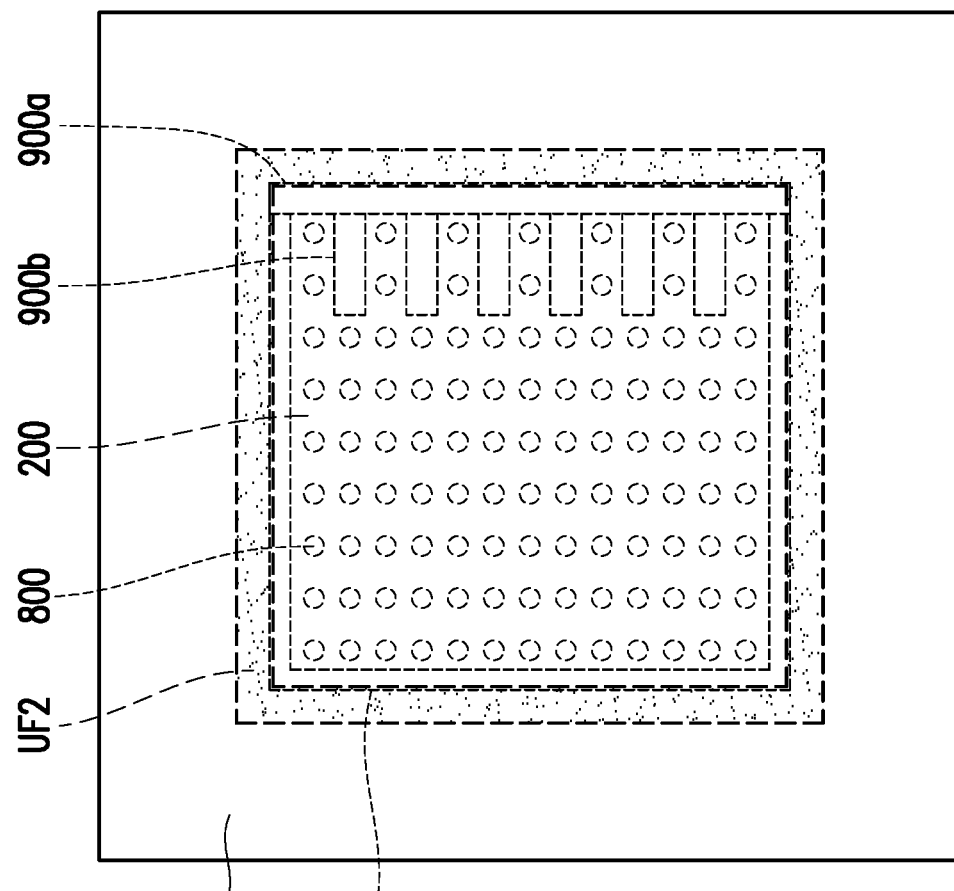
FIG. 6B is a bottom view of the package in FIG. 6A.
Figure 6B:
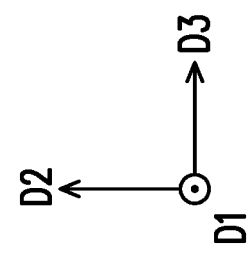
Figure 7A:
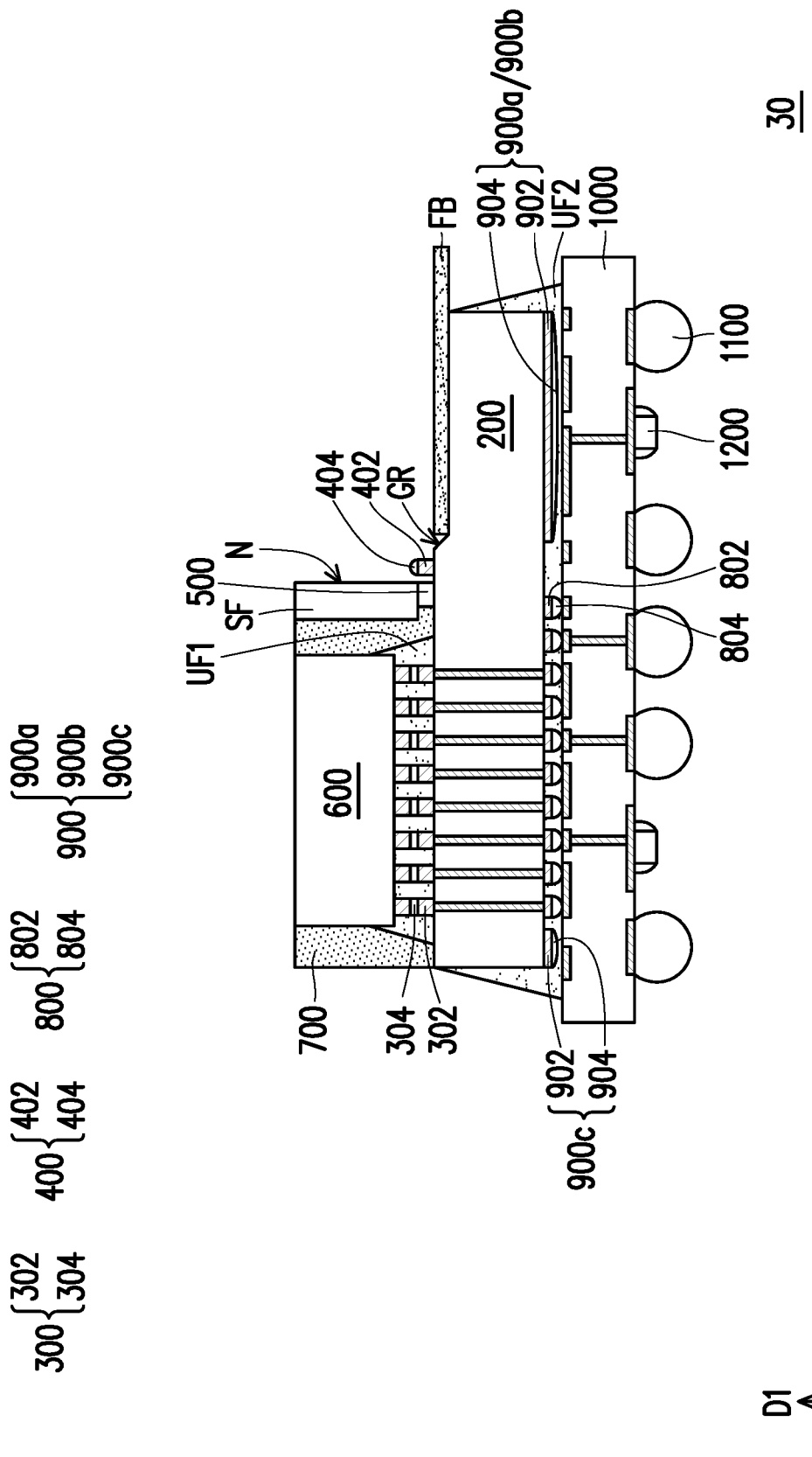
FIG. 7A is a schematic cross-sectional view of the package in FIG. 6A taken along line I-I'.
Figure 7B:
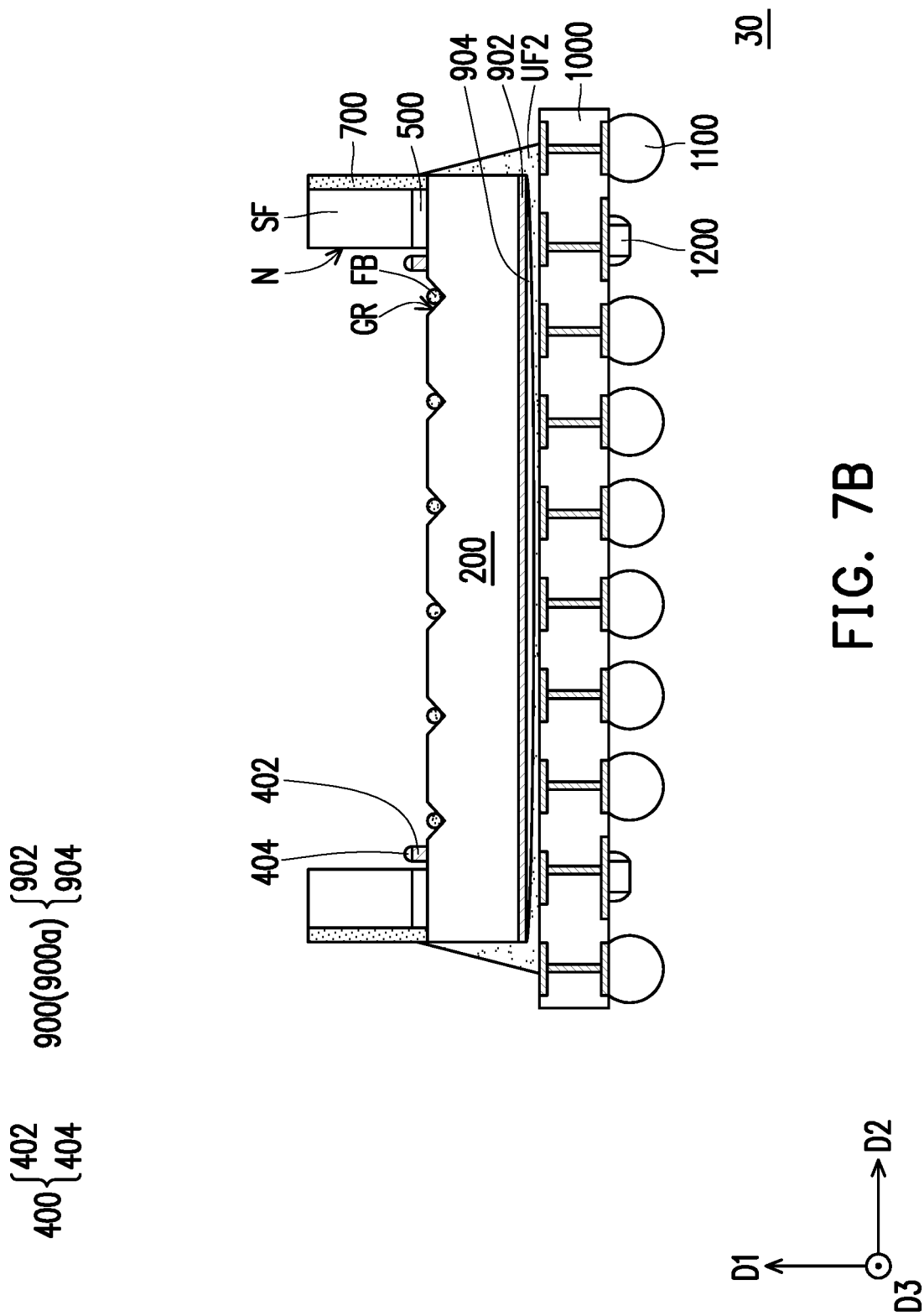
FIG. 7B is a schematic cross-sectional view of the package in FIG. 6A taken along line II-II'.
Figure 7C:
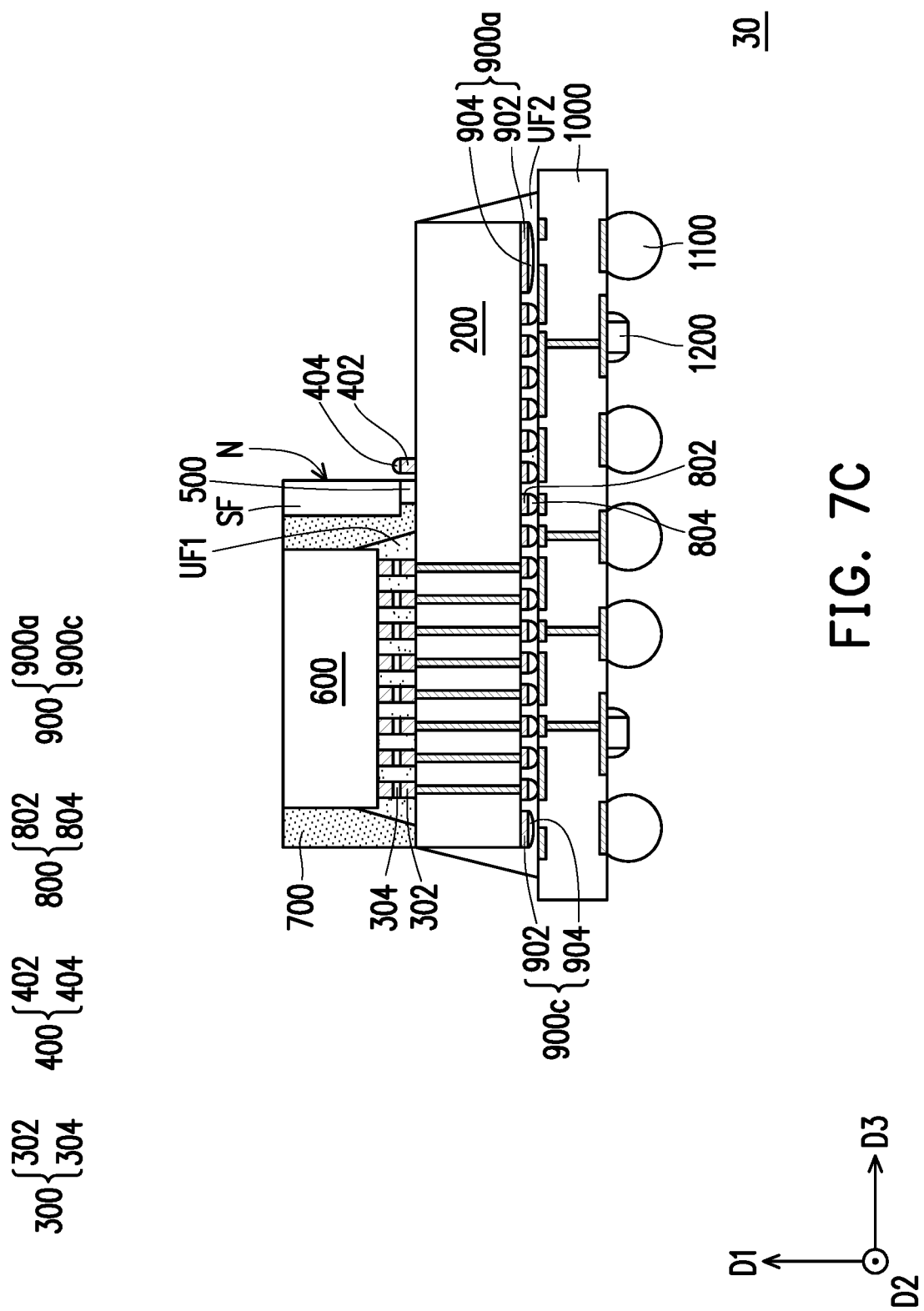
FIG. 7C is a schematic cross-sectional view of the package in FIG. 6A taken along line III-III'.

FIG. 6A is a top view of a package 30 in accordance with some alternative embodiments of the disclosure. FIG. 6B is a bottom view of the package 30 in FIG. 6A. FIG. 7A is a schematic cross-sectional view of the package 30 in FIG. 6A taken along line I-I'. FIG. 7B is a schematic cross-sectional view of the package 30 in FIG. 6A taken along line II-II'. FIG. 7C is a schematic cross-sectional view of the package 30 in FIG. 6A taken along line III-III'. For simplicity, the conductive terminals 1100 and the devices 1200 are omitted in FIG. 6B. Referring to FIGS. 6A-6B and FIGS. 7A-7C, the package 30 in FIGS. 6A-6B and FIGS. 7A-7C is similar to the package 10 in FIG. 1O, FIGS. 2A-2B, and FIGS. 3A-3B, so similar elements are denoted by the same reference numeral and the detailed descriptions thereof are omitted herein. The difference between the package 10 in FIG. 2A and the package 30 in FIG. 6A lies in that in package 30, the reinforcement structure 900 further includes an extending portion 900c extends from one end of the trunk portion 900a to another end of the trunk portion 900a. In some embodiments, the trunk portion 900a is disposed along one edge of the die 200. On the other hand, the extending portion 900c is disposed along the other three edges of the die 200. In other words, the trunk portion 900a and the extending portion 900c form a closed loop along four edged of the die 200. As illustrated in FIGS. 6A-6B and FIGS. 7A-7C, the branch portions 900b of the reinforcement structure 900 are aligned with the grooves GR from the top view. On the other hand, the trunk portion 900a may intersect with the grooves GR from the top view. In some embodiments, a width of the extending portion 900c ranges from about 50 micrometers to about 200 micrometers. In some embodiments, the width of the extending portion 900c is smaller than a width of the trunk portion 900a and/or a width of the branch portions 900b. However, the disclosure is not limited thereto. In some alternative embodiments, the widths of the trunk portion 900a, the branch portions 900b, and the extending portion 900c may be the same.

In some embodiments, the branch portions 900b may be collectively referred to as a first portion of the reinforcement structure 900 while the trunk portion 900a and the extending portion 900c may be collectively referred to as a second portion of the reinforcement structure 900. As illustrated in FIG. 6B, the trunk portion 900a and the extending portion 900c together surround the conductive terminals 800. In other words, the second portion of the reinforcement structure 900 surrounds the conductive terminals 800.

As illustrated in FIG. 7A and FIG. 7B, a thickness of the die 200 is not uniform. For example, the regions being occupied by the grooves GR have smaller thicknesses as compared to the regions not being occupied by the grooves GR. Therefore, during singulation of the wafer substrate WS2 (shown in FIG. 1M), stress may be generated at the regions being occupied by the grooves GR, thereby causing crack in the die 200. However, since the branch portions 900*b* of the reinforcement structure 900 are aligned with the grooves GR, the deficiencies in thicknesses of the regions occupied by the grooves GR may be compensated by the branch portions 900*b*. Moreover, since the trunk portion 900*a* is disposed along the cutting line during the singulation process and the extending portion 900*c* is disposed along three edges of the die 200, the trunk portion 900*a* and the extending portion 900*c* may further enhance the structure rigidity against stress generated. Furthermore, since the trunk portion 900*a* and the extending portion 900*c* are disposed along four edges of the die 200, sharp-corner interface between the die 200 and the underfill UF2 may be prevented. As a result, the issue of crack in the underfill UF2 may be sufficiently eliminated. As such, with the presence of the reinforcement structure 900, the crack issue in the die 200 derived from the singulation process may be alleviated, thereby enhancing the yield and reliability of the package 30.

Figure 8A:
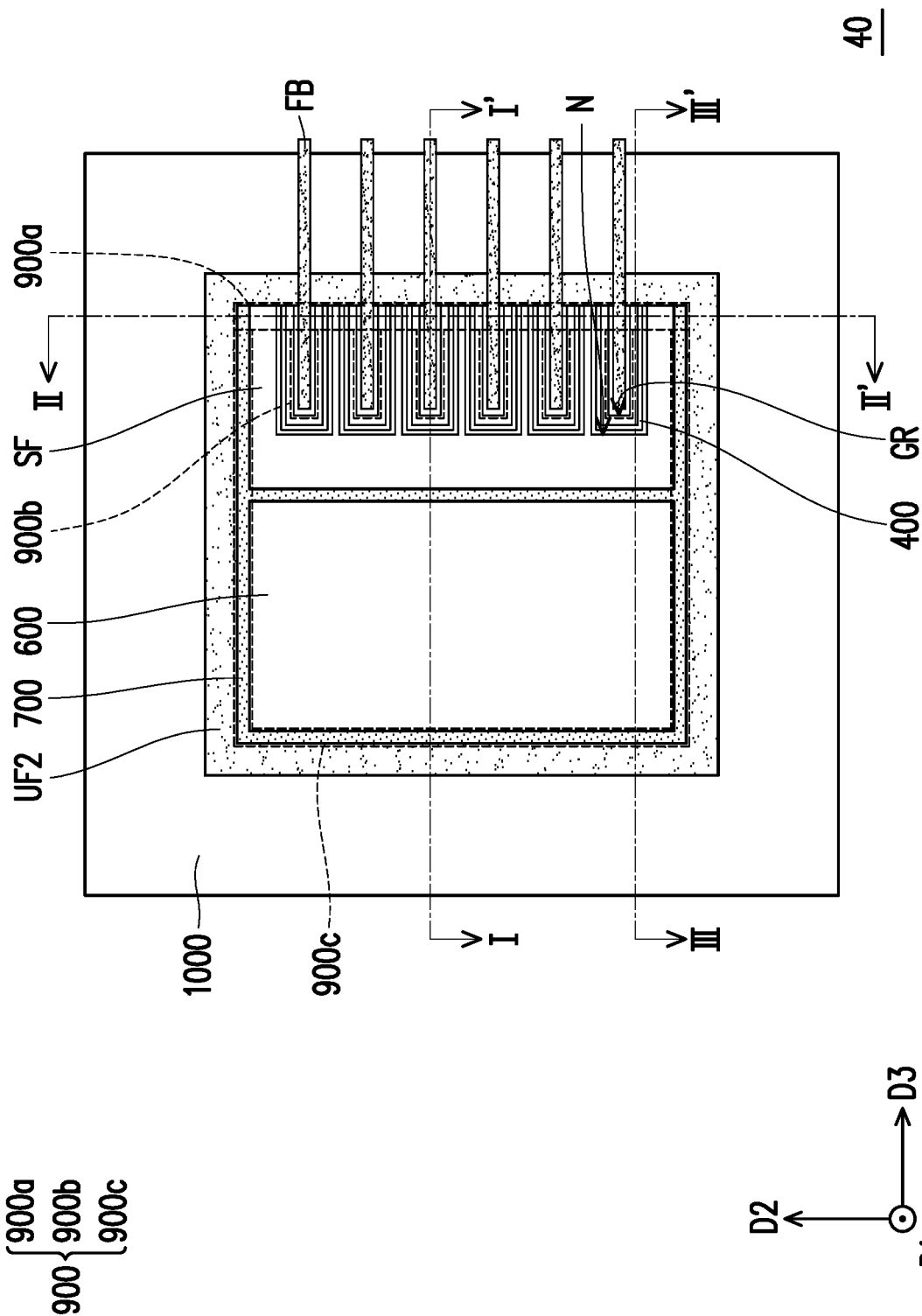
FIG. 8A is a top view of a package in accordance with some alternative embodiments of the disclosure.
Figure 8B:
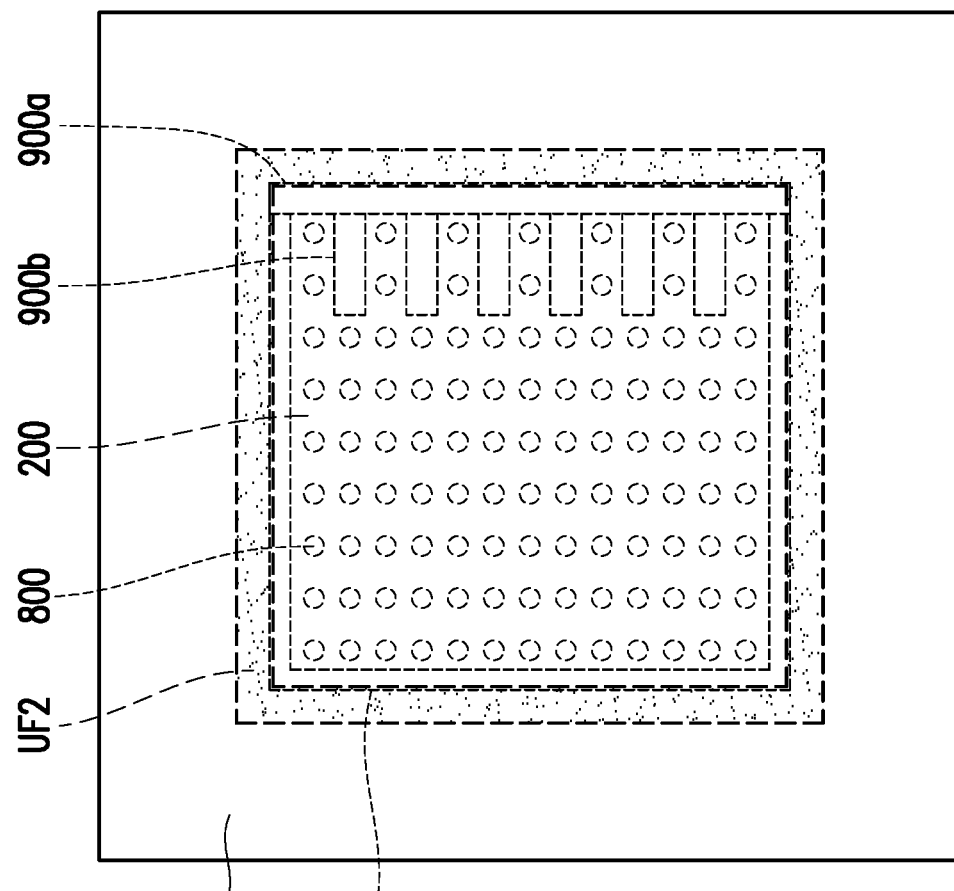
FIG. 8B is a bottom view of the package in FIG. 8A.
Figure 9A:
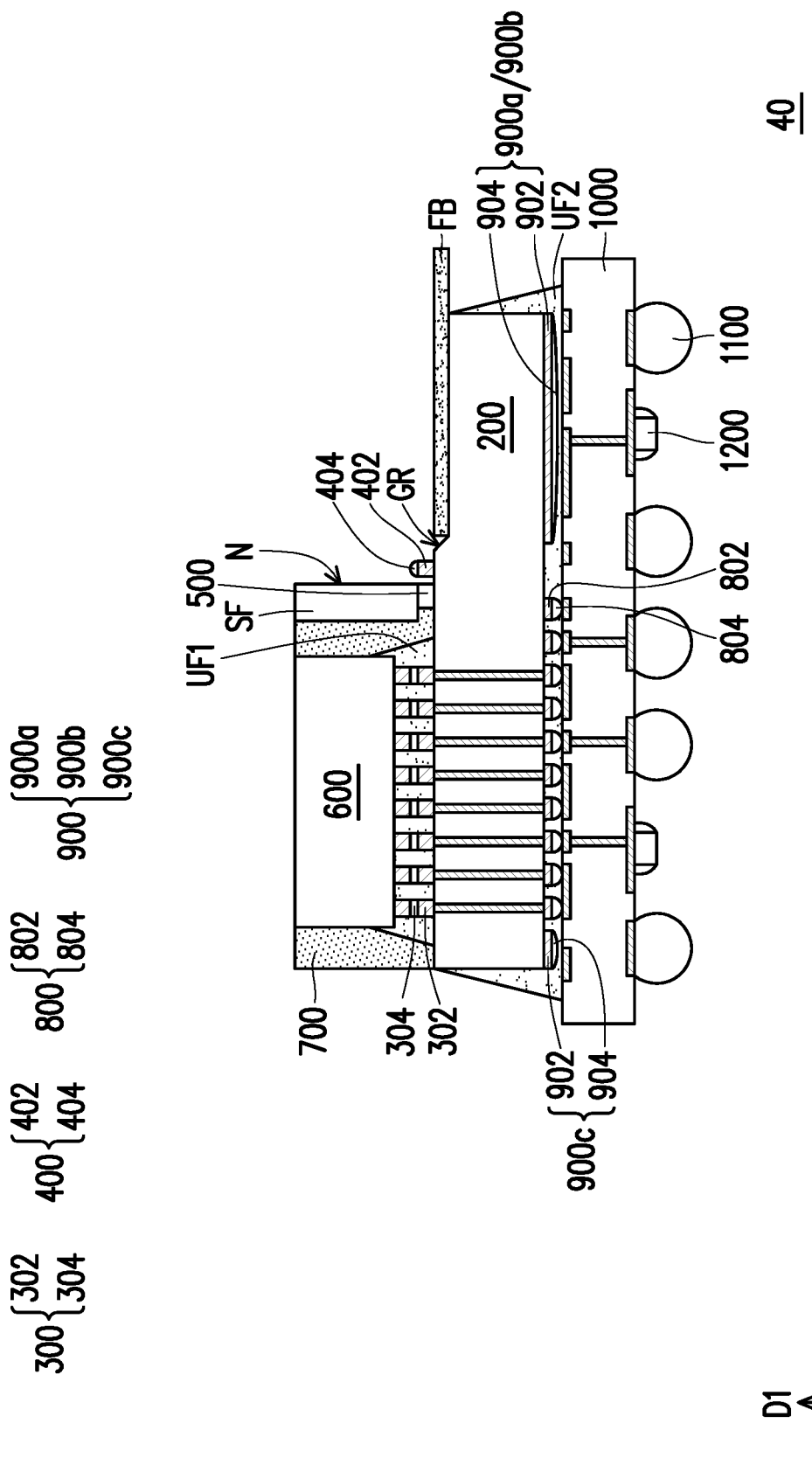
FIG. 9A is a schematic cross-sectional view of the package in FIG. 8A taken along line I-I'.
Figure 9B:
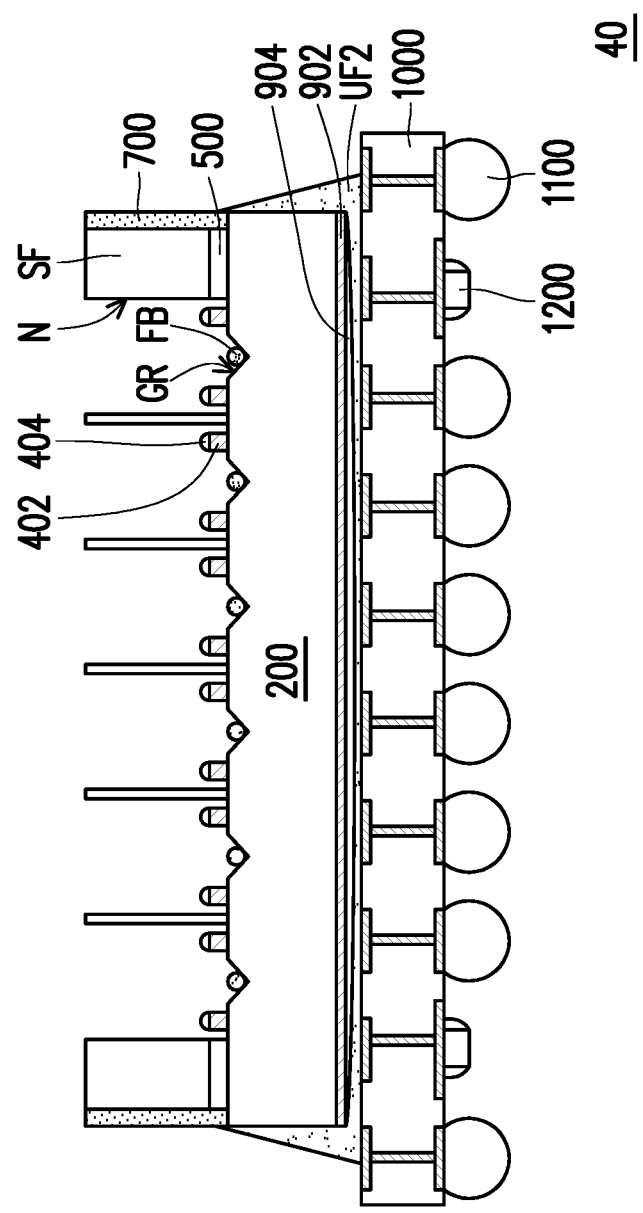
FIG. 9B is a schematic cross-sectional view of the package in FIG. 8A taken along line II-II'.
Figure 9C:
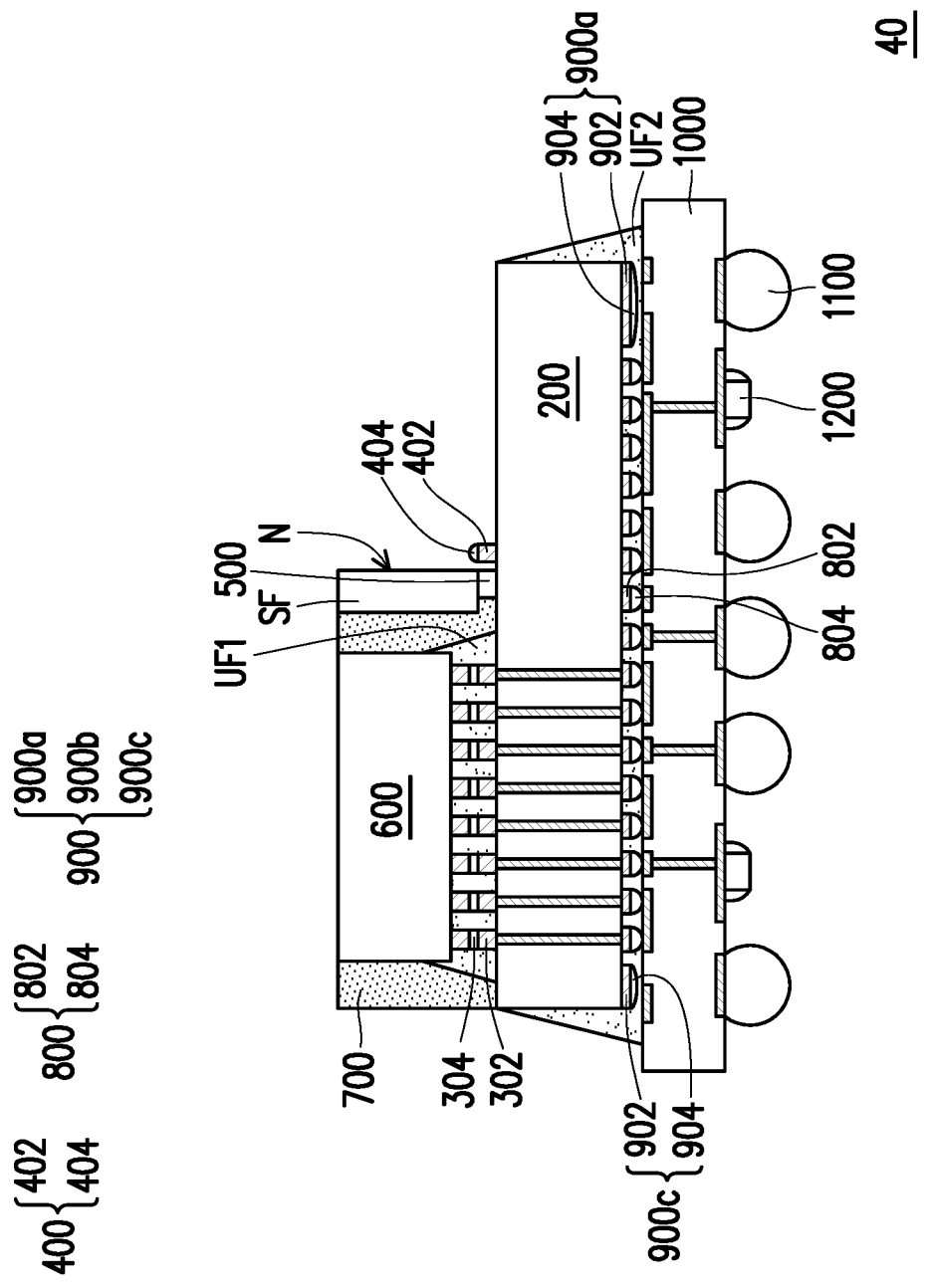
FIG. 9C is a schematic cross-sectional view of the package in FIG. 8A taken along line III-III'.

FIG. 8A is a top view of a package 40 in accordance with some alternative embodiments of the disclosure. FIG. 8B is a bottom view of the package 40 in FIG. 8A. FIG. 9A is a schematic cross-sectional view of the package 40 in FIG. 8A taken along line I-I'. FIG. 9B is a schematic cross-sectional view of the package 40 in FIG. 8A taken along line II-II'. FIG. 9C is a schematic cross-sectional view of the package 40 in FIG. 8A taken along line III-III'. For simplicity, the conductive terminals 1100 and the devices 1200 are omitted in FIG. 8B. Referring to FIGS. 8A-8B and FIGS. 9A-9C, the package 40 in FIGS. 8A-8B and FIGS. 9A-9C is similar to the package 30 in FIGS. 6A-6B and FIGS. 7A-7C, so similar elements are denoted by the same reference numeral and the detailed descriptions thereof are omitted herein. The difference between the package 30 in FIG. 6A and the package 40 in FIG. 8A lies in that in package 40, multiple notches N are formed in the semiconductor frame SF. Each notch N in the package 40 of FIG. 8A is smaller than the notch N in the package 30 of FIG. 6A. As illustrated in FIG. 8A, the number of the notches N corresponds to the number of the grooves GR. That is, each notch N accommodates one groove GR. Similar to that of the package 30, the reinforcement structure 900 of package 40 also includes a trunk portion 900*a*, a plurality of branch portions 900*b* extending out from the trunk portion 900*a*, and an extending portion 900*c* extending from one end of the trunk portion 900*a* to another end of the trunk portion 900*a*. As illustrated in FIGS. 8A-8B and FIGS. 9A-9C, the branch portions 900*b* of the reinforcement structure 900 are aligned with the grooves GR from the top view. On the other hand, the trunk portion 900*a* may intersect with the grooves GR from the top view.

As illustrated in FIG. 9A and FIG. 9B, a thickness of the die 200 is not uniform. For example, the regions being occupied by the grooves GR have smaller thicknesses as compared to the regions not being occupied by the grooves GR. Therefore, during singulation of the wafer substrate WS2 (shown in FIG. 1M), stress may be generated at the regions being occupied by the grooves GR, thereby causing crack in the die 200. However, since the branch portions 900*b* of the reinforcement structure 900 are aligned with the grooves GR, the deficiencies in thicknesses of the regions occupied by the grooves GR may be compensated by the branch portions 900*b*. Moreover, the smaller notches N in the package 40 allows less semiconductor material to be removed during the step shown in FIG. 1L, so the structure rigidity of the semiconductor frame SF may be sufficiently maintained. As a result, the warpage generated during the manufacturing process of the package 40 may be sufficiently suppressed. Furthermore, since the trunk portion 900*a* is disposed along the cutting line during the singulation process and the extending portion 900*c* is disposed along three edges of the die 200, the trunk portion 900*a* and the extending portion 900*c* may further enhance the structure rigidity against stress generated. As such, with the presence of the reinforcement structure 900, the crack issue in the die 200 derived from the singulation process may be alleviated, thereby enhancing the yield and reliability of the package 40.

In accordance with some embodiments of the disclosure, a package includes a first die, a second die, a semiconductor frame, and a reinforcement structure. The first die has a first surface and a second surface opposite to the first surface. The first die includes grooves on the first surface. The second die and the semiconductor frame are disposed side by side over the first surface of the first die. The semiconductor frame has at least one notch exposing the grooves of the first die. The reinforcement structure is disposed on the second surface of the first die. The reinforcement structure includes a first portion aligned with the grooves.

In accordance with some alternative embodiments of the disclosure, a package includes a circuit substrate, an interposer, a die, a semiconductor frame, a dam structure, conductive terminals, and a reinforcement structure. The interposer is disposed on the circuit substrate. The interposer includes grooves on a surface thereof opposite to the circuit substrate. The die and the semiconductor frame are disposed side by side over the interposer opposite to the circuit substrate. The semiconductor frame has at least one notch exposing the grooves of the interposer. The dam structure is disposed on the interposer and surrounded by the semiconductor frame. The conductive terminals are sandwiched between the circuit substrate and the interposer. The reinforcement structure is located between the circuit substrate and the interposer. The reinforcement structure includes a trunk portion and branch portions extending out from the trunk portion.

In accordance with some embodiments of the disclosure, a manufacturing method of a package includes at least the following steps. A wafer substrate having a first surface and a second surface opposite to the first surface is provided. The wafer substrate includes grooves formed on the first surface. Dies and a dummy die are placed over the first surface of the wafer substrate. The dummy die covers the grooves. The dies and the dummy die are laterally encapsulated by an encapsulant. Conductive terminals and a reinforcement structure are formed on the second surface of the wafer substrate. A portion of the reinforcement structure is aligned with the grooves. A portion of the dummy die is removed to form a semiconductor frame having at least one opening exposing the grooves. The semiconductor frame, the wafer substrate, and the reinforcement structure are singulated to form singulated structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
a first die having a first surface and a second surface opposite to the first surface, wherein the first die comprises grooves on the first surface;
a second die and a semiconductor frame disposed side by side over the first surface of the first die, wherein the semiconductor frame has at least one notch exposing the grooves of the first die; and
a reinforcement structure disposed on the second surface of the first die, wherein the reinforcement structure comprises a first portion aligned with the grooves.

2. The package of claim 1, wherein a projection of the grooves along a direction perpendicular to the first surface of the first die is overlapped with the first portion of the reinforcement structure.

3. The package of claim 1, wherein the reinforcement structure further comprises a second portion connected to the first portion, wherein the second portion is disposed along at least one edge of the first die.

4. The package of claim 3, wherein the first portion of the reinforcement structure extends along a first direction and the second portion of the reinforcement structure extends along a second direction perpendicular to the first direction.

5. The package of claim 3, wherein the second portion of the reinforcement structure is disposed along four edges of the first die.

6. The package of claim 1, wherein the reinforcement structure is electrically floating.

7. The package of claim 1, further comprising:
an encapsulant over the first die, wherein the encapsulant laterally encapsulates the second die;
a dam structure disposed along edges of the at least one notch;
optical fibers located in the grooves;
conductive terminals disposed on the second surface of the first die; and
a circuit substrate over the second surface of the first die.

8. The package of claim 7, wherein the conductive terminals are directly in contact with the circuit substrate, and the reinforcement structure is spaced apart from the circuit substrate.

9. A package, comprising:
a circuit substrate;
an interposer disposed on the circuit substrate, wherein the interposer comprises grooves on a surface thereof opposite to the circuit substrate;
a die and a semiconductor frame disposed side by side over the interposer opposite to the circuit substrate, wherein the semiconductor frame has at least one notch exposing the grooves of the interposer;
a dam structure disposed on the interposer and surrounded by the semiconductor frame;
conductive terminals sandwiched between the circuit substrate and the interposer; and
a reinforcement structure located between the circuit substrate and the interposer, wherein the reinforcement structure comprises a trunk portion and branch portions extending out from the trunk portion.

10. The package of claim 9, wherein the conductive terminals and the reinforcement structure are made of the same material.

11. The package of claim 9, wherein the branch portions of the reinforcement structure are aligned with the grooves.

12. The package of claim 9, wherein the trunk portion of the reinforcement structure extends along an edge of the interposer.

13. The package of claim 9, wherein the reinforcement structure further comprises an extending portion extends from one end of the trunk portion to another end of the trunk portion.

14. The package of claim 9, wherein the reinforcement structure is electrically floating.

15. The package of claim 9, further comprising:
an encapsulant over the interposer, wherein the encapsulant laterally encapsulates the die; and
optical fibers located in the grooves.

16. A manufacturing method of a package, comprising:
providing a wafer substrate having a first surface and a second surface opposite to the first surface, wherein the wafer substrate comprises grooves formed on the first surface;
placing dies and a dummy die over the first surface of the wafer substrate, wherein the dummy die covers the grooves;
laterally encapsulating the dies and the dummy die by an encapsulant;
forming conductive terminals and a reinforcement structure on the second surface of the wafer substrate, wherein a portion of the reinforcement structure is aligned with the grooves;
removing a portion of the dummy die to form a semiconductor frame having at least one opening exposing the grooves; and
singulating the semiconductor frame, the wafer substrate, and the reinforcement structure to form singulated structures.

17. The method of claim 16, further comprising forming a dam structure on the first surface of the wafer substrate, wherein the dam structure surrounds the grooves.

18. The method of claim 17, wherein the dummy die comprises a trench, and placing dies over the first surface of the wafer substrate comprises fitting the dam structure into the trench.

19. The method of claim 16, further comprising:
mounting the singulated structure onto a circuit substrate; and
performing a reflow process on the conductive terminals and the reinforcement structure to reshape the reinforcement structure.

20. The method of claim 16, further comprising placing optical fibers in the grooves.

* * * * *